US012382764B2

(12) United States Patent
Hong et al.

(10) Patent No.: US 12,382,764 B2
(45) Date of Patent: Aug. 5, 2025

(54) DISPLAY DEVICE

(71) Applicant: Samsung Display Co., LTD., Yongin-si (KR)

(72) Inventors: Kwang Taek Hong, Seoul (KR); Hong Joon Moon, Cheonan-si (KR); Jong Hwan Cha, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 680 days.

(21) Appl. No.: 17/836,609

(22) Filed: Jun. 9, 2022

(65) Prior Publication Data

US 2023/0032600 A1    Feb. 2, 2023

(30) Foreign Application Priority Data

Jul. 27, 2021  (KR) .......................... 10-2021-0098438

(51) Int. Cl.
*H10H 20/857*    (2025.01)
*G09G 3/3258*    (2016.01)
*H01L 25/075*    (2006.01)
*H01L 25/16*     (2023.01)
*H10D 86/40*     (2025.01)
*H10H 20/819*    (2025.01)
(Continued)

(52) U.S. Cl.
CPC ...... *H10H 20/857* (2025.01); *H10H 20/8312* (2025.01); *H10H 29/142* (2025.01)

(58) Field of Classification Search
CPC ........... G09G 3/3258; G09G 2300/043; H10H 20/857; H10H 20/819; H01L 25/0753; H01L 25/167
See application file for complete search history.

(56) References Cited

U.S. PATENT DOCUMENTS 10,002,918 B2    6/2018  Park et al.
2019/0181200 A1*  6/2019  Jung .................... H10K 50/805
(Continued)

FOREIGN PATENT DOCUMENTS

KR   10-2017-0096644    8/2017
KR   10-2020-0034896    4/2020
(Continued)

*Primary Examiner* — Mohsen Ahmadi
(74) *Attorney, Agent, or Firm* — KILE PARK REED & HOUTTEMAN PLLC

(57) ABSTRACT

A display device comprises an initialization voltage line on a substrate, a first interlayer insulating layer disposed on the initialization voltage line, a low potential voltage line disposed on the first interlayer insulating layer, and having a stepped portion and overlapping the initialization voltage line, an auxiliary pattern disposed on the low potential voltage line and forming a flat portion with the stepped portion of the low potential voltage line, a second interlayer insulating layer disposed on the auxiliary pattern, a planarization layer disposed on the second interlayer insulating layer, a first electrode and a second electrode disposed on the planarization layer and spaced apart from each other, a light emitting element having ends aligned on the first electrode and the second electrode, a first contact electrode electrically contacting an end of the light emitting element, and a second contact electrode electrically contacting another end of the light emitting element.

18 Claims, 22 Drawing Sheets

(51) Int. Cl.
    *H10H 20/831*     (2025.01)
    *H10H 20/85*     (2025.01)
    *H10H 29/14*     (2025.01)

(56) References Cited

U.S. PATENT DOCUMENTS

| | | | |
|---|---|---|---|
| 2021/0098733 A1* | 4/2021 | Baik | H10K 59/12 |
| 2021/0359036 A1* | 11/2021 | You | H10K 59/35 |
| 2021/0384392 A1* | 12/2021 | Yang | H01L 25/13 |
| 2021/0399022 A1* | 12/2021 | Park | H10D 86/60 |
| 2022/0173206 A1* | 6/2022 | Lim | H10K 59/1315 |
| 2022/0181395 A1* | 6/2022 | Youn | H10K 59/131 |
| 2022/0208130 A1* | 6/2022 | Park | G09G 3/3291 |
| 2023/0005987 A1 | 1/2023 | Kang et al. | |
| 2023/0230957 A1* | 7/2023 | Kim | H10D 86/423 |
| | | | 345/690 |

FOREIGN PATENT DOCUMENTS

| | | |
|---|---|---|
| KR | 10-2021-0074456 | 6/2021 |
| KR | 10-2021-0086317 | 7/2021 |
| KR | 10-2023-0010104 | 1/2023 |

\* cited by examiner

DISPLAY DEVICE

CROSS-REFERENCE TO RELATED APPLICATION(S)

This application claims priority to and benefits of Korean Patent Application No. 10-2021-0098438 under 35 U.S.C. 119, filed on Jul. 27, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD), and the like have been used.

A display device is a device for displaying an image, and may include a display panel, such as an organic light emitting display panel or a liquid crystal display panel. The light emitting display panel may include light emitting elements, e.g., light emitting diodes (LED). Examples of the light emitting diode include an organic light emitting diode (OLED) using an organic material as a light emitting material, and an inorganic light emitting diode using an inorganic material as a light emitting material.

SUMMARY

Aspects of the disclosure provide a display device capable of improving display quality by preventing the occurrence of defects in a contact hole due to a lower step.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include an initialization voltage line disposed in a direction on a substrate, a first interlayer insulating layer disposed on the initialization voltage line, a low potential voltage line disposed on the first interlayer insulating layer, the low potential voltage line including a stepped portion and overlapping the initialization voltage line, an auxiliary pattern disposed on the low potential voltage line and forming a flat portion with the stepped portion of the low potential voltage line, a second interlayer insulating layer disposed on the auxiliary pattern, a planarization layer disposed on the second interlayer insulating layer, a first electrode and a second electrode that are disposed on the planarization layer and spaced apart from each other, a light emitting element having ends aligned on the first electrode and the second electrode, a first contact electrode electrically contacting an end of the light emitting element, and a second contact electrode electrically contacting another end of the light emitting element.

In an embodiment, a top surface of the auxiliary pattern and a top surface of the low potential voltage line may be aligned and coincide with each other.

In an embodiment, a distance from a top surface of the planarization layer to a top surface of the auxiliary pattern may be equal to a distance from the top surface of the planarization layer to a top surface of the low potential voltage line.

In an embodiment, the auxiliary pattern may overlap the low potential voltage line, and at least one side of the auxiliary pattern may be aligned and coincide with a side of the low potential voltage line.

In an embodiment, the auxiliary pattern may contact the top surface of the low potential voltage line, and the auxiliary pattern may not contact the first interlayer insulating layer.

In an embodiment, the auxiliary pattern may overlap the low potential voltage line, and at least a part of the auxiliary pattern may not overlap the low potential voltage line.

In an embodiment, the auxiliary pattern may contact the top surface of the low potential voltage line, and the auxiliary pattern may contact the first interlayer insulating layer.

In an embodiment, the auxiliary pattern may overlap the low potential voltage line, and the auxiliary pattern may have at least one side spaced apart inward from a side of the low potential voltage line.

In an embodiment, the auxiliary pattern may include a metal, and the metal may be at least one of titanium and copper.

In an embodiment, the auxiliary pattern may overlap the low potential voltage line, and the auxiliary pattern may not overlap the initialization voltage line.

In an embodiment, the second electrode may overlap the auxiliary pattern and the low potential voltage line.

In an embodiment, the second electrode may contact the auxiliary pattern and the low potential voltage line through a second electrode contact hole, and the second electrode contact hole may expose the second interlayer insulating layer and the planarization layer.

According to an embodiment of the disclosure, a display device may include a substrate including a first sub-pixel, a second sub-pixel, and a third sub-pixel disposed adjacent to each other, a low potential voltage line and a data line that are disposed on a side of each of the first sub-pixel, the second sub-pixel, and the third sub-pixel on the substrate, an initialization voltage line disposed between the low potential voltage line of the first sub-pixel and the data line of the first sub-pixel, the initialization voltage line at least partially overlapping the low potential voltage line, and an auxiliary pattern overlapping the low potential voltage line of the first sub-pixel without overlapping the low potential voltage line of the second sub-pixel and the low potential voltage line of the third sub-pixel. A top surface of the auxiliary pattern may be aligned and coincide with a top surface of the low potential voltage line of the first sub-pixel.

In an embodiment, the display device may further include a first interlayer insulating layer disposed between the initialization voltage line and the low potential voltage line, wherein the first interlayer insulating layer includes a step formed by the initialization voltage line.

In an embodiment, the low potential voltage line of the first sub-pixel may include a stepped portion formed by the step of the first interlayer insulating layer, and the auxiliary pattern may form a flat portion with the stepped portion of the low potential voltage line.

In an embodiment, the auxiliary pattern may not overlap the initialization voltage line and the data line of the first sub-pixel.

In an embodiment, the display device may further include a second interlayer insulating layer disposed on the low potential voltage line, a planarization layer disposed on the second interlayer insulating layer, a first electrode and a second electrode that are disposed on the planarization layer and spaced apart from each other, a light emitting element having ends aligned on the first electrode and the second electrode, a first contact electrode electrically contacting an end of the light emitting element, and a second contact electrode electrically contacting another end of the light emitting element.

In an embodiment, a distance from a top surface of the planarization layer to a top surface of the auxiliary pattern may be equal to a distance from the top surface of the planarization layer to a top surface of the low potential voltage line.

In an embodiment, the second electrode may contact the auxiliary pattern and the low potential voltage line through a second electrode contact hole, and the second electrode contact hole may expose the second interlayer insulating layer and the planarization layer.

In an embodiment, at least one side of the auxiliary pattern may be aligned and coincide with a side of the low potential voltage line.

The display device according to embodiments may include an auxiliary pattern for flattening a stepped portion of a low potential voltage line, thereby preventing a defect in a second electrode contact hole. Accordingly, it may be possible to improve the display quality by improving a reddish defect of the display device.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
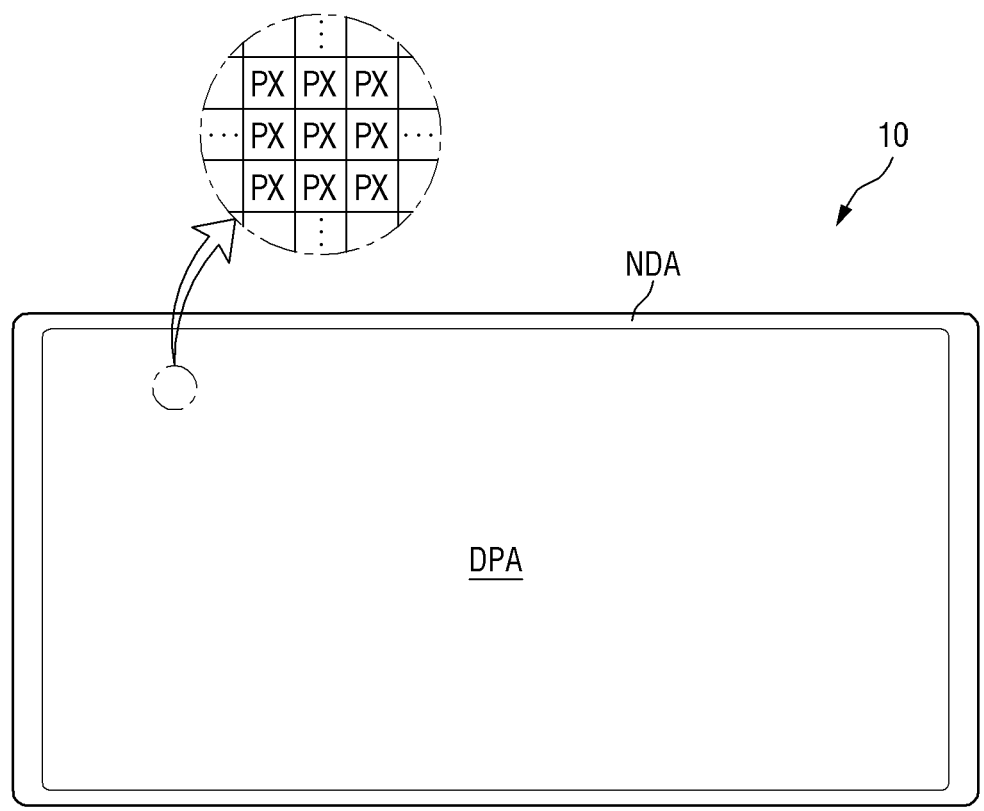
FIG. 1 is a schematic plan view of a display device according to an embodiment.
Figure 1:
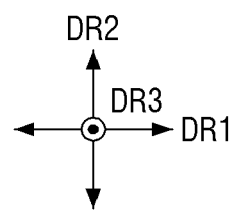

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

Each of the features of the various embodiments of the disclosure may be combined or combined with each other, in part or in whole, and technically various interlocking and driving are possible. Each embodiment may be implemented independently of each other or may be implemented together in an association.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

The terms "above," "top," and "top surface" as used herein may refer to an upward direction (e.g., a side of a third direction DR3) with respect to a display device 10. The terms "below," "bottom," and "bottom surface" as used herein may refer to the other side of the third direction DR3. Further, "left," "right," "upper," and "lower" may indicate directions when the display device 10 is viewed from above. For example, "left" may indicate a side of a first direction DR1, "right" may indicate the other side of the first direction DR1, "upper" may indicate a side of a second direction DR2, and "lower" may indicate the other side of the second direction DR2.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which may provide a display screen.

The display device 10 may include a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be used as an example, but the disclosure is not limited thereto, and other display panels may be applied staying within the scope of the present disclosure.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape, and/or a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and a pixel may be a rhombic shape in which each side may be inclined with respect to a direction. The pixels PX may be alternately disposed in a stripe type or a PenTile® type. Each of the pixels PX may include one or more light emitting elements 30 that emit light of a specific wavelength band to display a specific color.

The non-display area NDA may be disposed adjacent to (e.g., around) the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
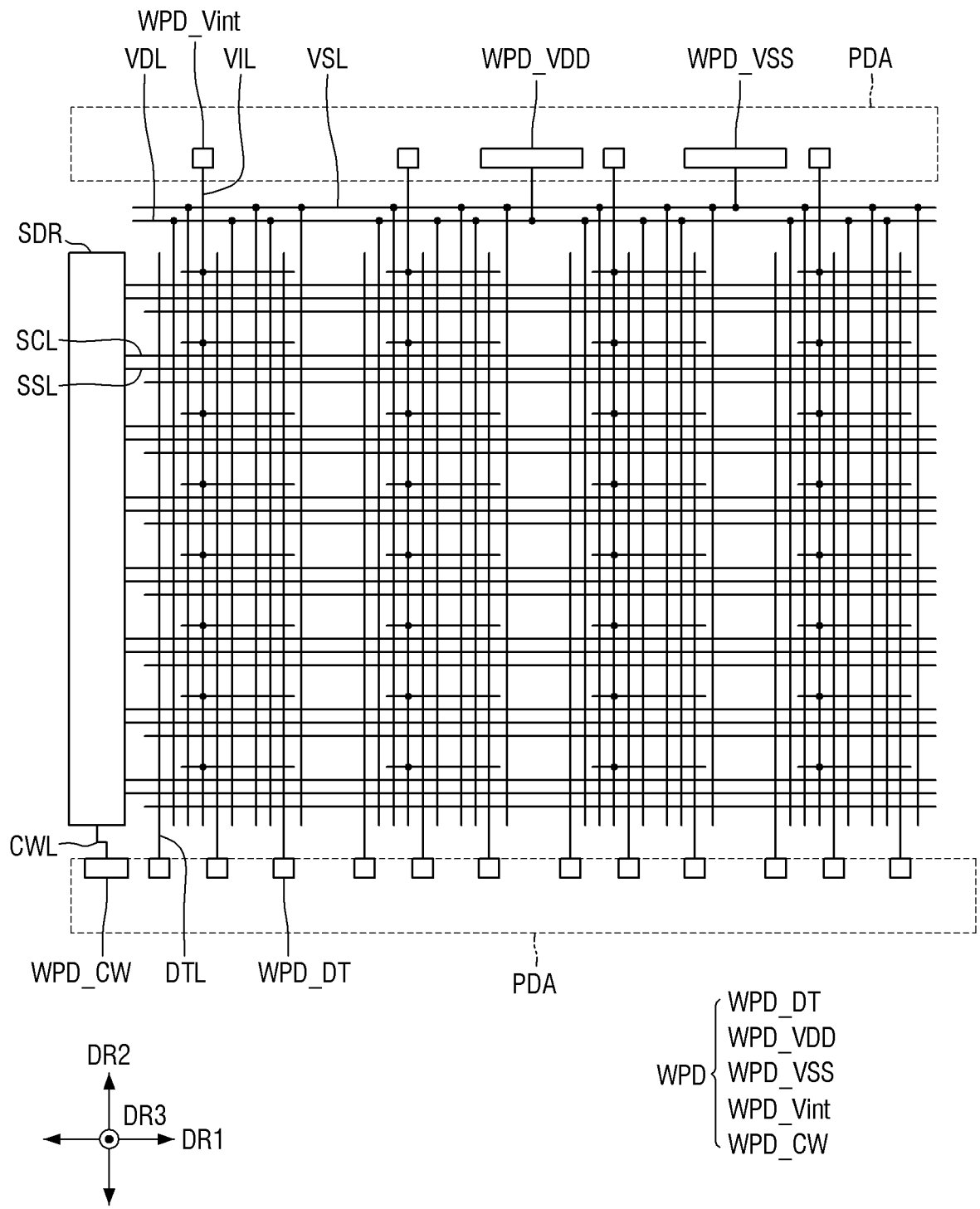
FIG. 2 is a schematic layout diagram showing wires included in a display device according to an embodiment.

FIG. 2 is a schematic layout diagram showing wires included in a display device according to an embodiment.

Referring to FIG. 2, the display device 10 may include multiple wires. The wires may include a scan line SCL, a sensing line SSL, a data line DTL, an initialization voltage line VIL, a high potential voltage line VDL, a low potential voltage line VSL, and the like. Although not shown in the drawing, other wires may be further provided in the display device 10.

The scan line SCL and the sensing line SSL may extend in a first direction DR1. The scan line SCL and the sensing line SSL may be connected to the scan driver SDR. The scan driver SDR may include a driving circuit. The scan driver SDR may be arranged on a side of the display area DPA in the first direction DR1, but is not limited thereto. The scan driver SDR may be connected to a signal connection line CWL, and at least one end of the signal connection line CWL may form a pad WPD_CW in the non-display area NDA to be connected to the external device.

The term "connected" as used herein may mean not only that one member may be connected to another member through a physical contact, but also that one member may be connected to another member through yet another member. This may also be understood as one part and the other part as integral elements may be connected into an integrated element via another element. Furthermore, if one element may be connected to another element, this may be construed as a meaning including an electrical connection via another element in addition to a direct connection in physical contact.

The data line DTL and the initialization voltage line VIL may extend in a second direction DR2 intersecting the first direction DR1. The initialization voltage line VIL may further include, in addition to a portion extending in the second direction DR2, a portion branched in the first direction DR1 therefrom. The high potential voltage line VDL and the low potential voltage line VSL may also include a portion extending in the second direction DR2 and a portion connected thereto to extend in the first direction DR1. The high potential voltage line VDL and the low potential voltage line VSL may have a mesh structure, but are not limited thereto. Although not shown in the drawing, each pixel PX of the display device 10 may be connected to at least one data line DTL, the initialization voltage line VIL, the high potential voltage line VDL, and the low potential voltage line VSL.

The data line DTL, the initialization voltage line VIL, the high potential voltage line VDL, and the low potential voltage line VSL may be electrically connected to at least one wire pad WPD. Each wire pad WPD may be disposed in the non-display area NDA. In an embodiment, a wire pad WPD_DT (hereinafter, referred to as "data pad") of the data line DTL may be disposed in a pad area PDA located on a side of the display area DPA in the second direction DR2. Further, a wire pad WPD_Vint (hereinafter, referred to as "initialization voltage pad") of the initialization voltage line VIL, a wire pad WPD_VDD (hereinafter, referred to as "first power pad") of the high potential voltage line VDL, and a wire pad WPD_VSS (hereinafter, referred to as "second power pad") of the low potential voltage line VSL may be disposed in a pad area PDA located on the other side of the display area DPA in the second direction DR2. As another example, the data pad WPD_DT, the initialization voltage pad WPD_Vint, the high-potential power pad WPD_VDD, and the low potential power pad WPD_VSS may all be disposed in the same area, e.g., in the non-display area NDA located above the display area DPA. The external devices may be mounted on the wire pads WPD. The external devices may be mounted on the wire pads WPD by applying an anisotropic conductive film, ultrasonic bonding or the like.

Each pixel PX or sub-pixel SPXn (n may be an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified pixel PX structures such as a 2T1C structure, a 6T1C structure, or a 7T1C structure may be applied.

Figure 3:
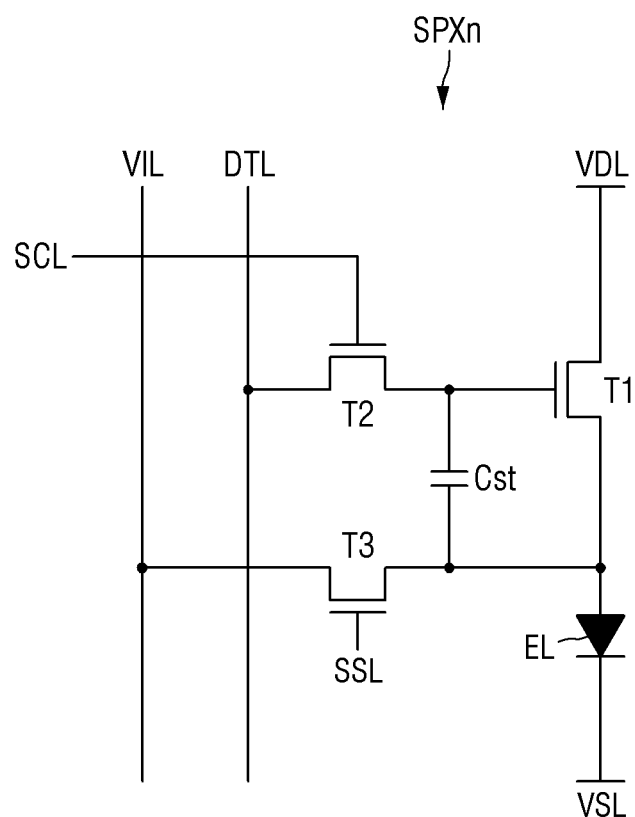
FIG. 3 is a schematic circuit diagram of a sub-pixel according to an embodiment.

FIG. 3 is a schematic circuit diagram of a sub-pixel according to an embodiment.

Referring to FIG. 3, each sub-pixel SPXn of the display device 10 according to an embodiment may include three transistors T1, T2 and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between them. The light emitting element may emit light of a specific wavelength band by electrical signals transmitted from the first electrode and the second electrode.

An end of the light emitting diode EL may be connected to the source electrode of the first transistor T1, and another end thereof may be connected to the low potential voltage line VSL to which a low potential voltage (hereinafter, a second power voltage) lower than a high potential voltage (hereinafter, a first power voltage) of the high potential voltage line VDL may be supplied.

The first transistor T1 adjusts a current flowing from the high potential voltage line VDL, to which the first power voltage may be supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the high potential voltage line VDL to which the first power voltage may be applied.

The second transistor T2 may be turned on by a scan signal of the scan line SCL to connect the data line DTL to the gate electrode of the first transistor T1. The gate electrode of the second transistor T2 may be connected to the scan line SCL, the source electrode thereof may be connected to the gate electrode of the first transistor T1, and the drain electrode thereof may be connected to the data line DTL.

The third transistor T3 may be turned on by a sensing signal of the sensing line SSL to connect the initialization voltage line VIL to one end of the light emitting diode EL. The gate electrode of the third transistor T3 may be connected to the sensing line SSL, the drain electrode thereof may be connected to the initialization voltage line VIL, and the source electrode thereof may be connected to one end of the light emitting diode EL or to the source electrode of the first transistor T1.

In an embodiment, the source electrode and the drain electrode of each of the transistors T1, T2, and T3 are not limited to those described above, and may be arranged in an opposite direction.

The storage capacitor Cst may be formed between the gate electrode and the source electrode of the first transistor T1. The storage capacitor Cst may store a difference voltage between a gate voltage and a source voltage of the first transistor T1.

Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. In other embodiments, some of the transistors T1, T2, and T3 may be formed of an N-type MOSFET and the others may be formed of a P-type MOSFET.

Hereinafter, a structure of a pixel PX of the display device 10 according to an embodiment will be described in detail with further reference to other drawings.

Figure 4:
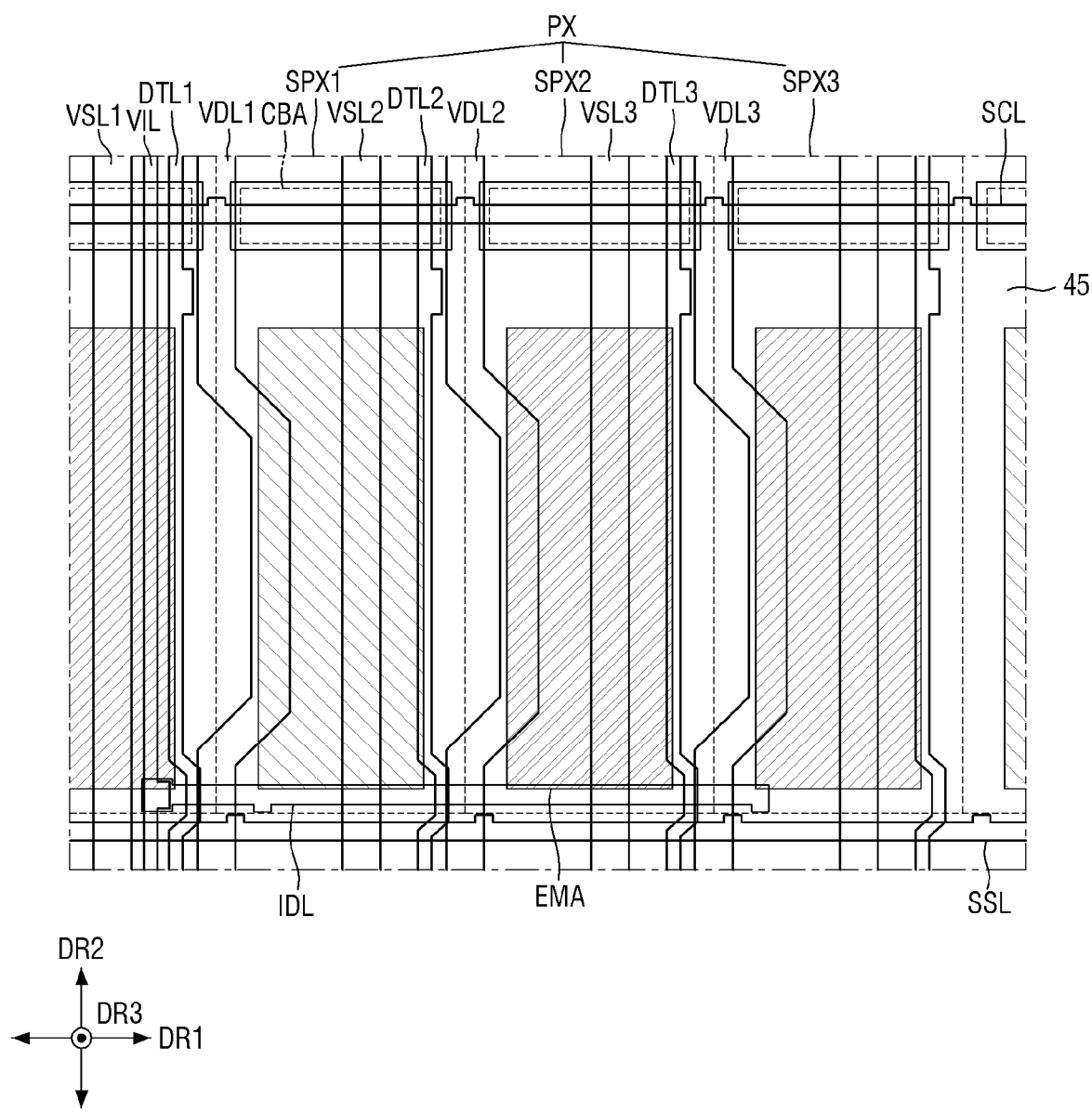
FIG. 4 is a schematic plan view showing wires disposed in a pixel of a display device according to an embodiment.

FIG. 4 is a schematic plan view showing wires disposed in a pixel of a display device according to an embodiment. FIG. 4 illustrates a schematic shape of a second bank 45 and wires disposed in each pixel PX of the display device 10 while omitting members disposed in an emission area EMA of each sub-pixel SPXn and some conductive layers disposed therebelow. In each of the drawings below, both sides in the first direction DR1 may be referred to as left and right sides, respectively, and both sides in the second direction DR2 may be referred to as upper and lower sides, respectively.

Referring to FIG. 4, the pixel PX of the display device 10 may include multiple sub-pixels SPXn (where n may be an integer of 1 to 3). For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be red, the second color may be green, and the third color may be blue. However, the disclosure is not limited thereto, and the sub-pixels SPXn may emit light of the same color.

Each sub-pixel SPXn of the display device 10 may include an emission area EMA and a non-emission area (not shown). In the emission area EMA, a light emitting element 30 (see FIG. 7) may be disposed to emit light of a specific wavelength band. In the non-emission area, light emitting elements 30 may not be disposed and light emitted from the light emitting elements 30 may not reach the non-emission area, so that no light may be emitted. The emission area may include an area in which a light emitting element 30 may be disposed, and an area adjacent to the light emitting element 30 to emit light emitted from the light emitting element 30.

Without being limited thereto, the emission area may also include an area in which the light emitted from a light emitting element 30 may be reflected or refracted by another member and emitted. The light emitting elements 30 may be disposed in each sub-pixel SPXn, and the emission area may be formed to include an area where the light emitting elements 30 may be disposed and an area adjacent thereto.

Each sub-pixel SPXn may further include a sub-region CBA disposed in the non-emission area. The sub-region CBA may be disposed on a side of the emission area EMA in a second direction DR2. The sub-region CBA may be disposed between the emission areas EMA of the sub-pixels SPXn adjacent in the second direction DR2. The emission areas EMA and sub-regions CBA may be arranged in the display area DPA of the display device 10. For example, the emission areas EMA and the sub-regions CBA may each be repeatedly disposed in a first direction DR1 and alternately disposed in the second direction DR2. The separation distance between the sub-regions CBA in the first direction DR1 may be smaller than the separation distance between the emission areas EMA in the first direction DR1. As will be described later, the second bank 45 may be disposed between the sub-regions CBA and the emission areas EMA, and a distance between them may vary depending on the width of the second bank 45. Although light may not be emitted from the sub-region CBA because of no light emitting element 30 disposed therein, a part of electrodes 21 and 22 provided in each sub-pixel SPXn may be disposed in the sub-region CBA. The electrodes 21 and 22 provided in each sub-pixel SPXn may be disposed separately from each other in the sub-region CBA.

The second bank 45 may include portions extending in the first direction DR1 and the second direction DR2 in plan view to be arranged in a grid pattern over the entire surface of the display area DPA. The second bank 45 may be disposed across the boundary of each sub-pixel SPXn to delimit neighboring sub-pixels SPXn. The second bank 45 may also be arranged to surround the emission area EMA and the sub-region CBA disposed for each sub-pixel SPXn to delimit them from each other. In a portion extending in the second direction DR2 of the second bank 45, a portion disposed between the emission areas EMA may have a larger width than a portion disposed between the sub-regions CBA. Accordingly, the distance between the sub-regions CBA may be smaller than the distance between the emission areas EMA. A more detailed description of the second bank 45 will be described later.

Multiple wires may be disposed in each pixel PX and sub-pixel SPXn of the display device 10. For example, the display device 10 may include an initialization voltage distribution line IDL disposed across some sub-pixels SPXn, in addition to the scan line SCL and the sensing line SSL disposed to extend in the first direction DR1. The display device 10 may include data lines DTL1, DTL2 and DTL3, the initialization voltage line VIL, high potential voltage lines VDL1, VDL2, and VDL3, and low potential voltage lines VSL1, VSL2, and VSL3 arranged to extend in the second direction DR2.

The scan line SCL may extend in the first direction DR1 and may be disposed across multiple sub-pixels SPXn arranged in the first direction DR1. Multiple scan lines SCL may be disposed to be spaced apart from each other in the second direction DR2 over the entire display area DPA. The scan line SCL may be disposed on the upper side of each pixel PX or sub-pixel SPXn with respect to the center thereof. The scan line SCL may be electrically connected to the gate electrode of the second transistor T2, and may apply a scan signal to the second transistor T2.

Similarly, the sensing line SSL may extend in the first direction DR1 and may be disposed across multiple sub-pixels SPXn arranged in the first direction DR1. Sensing lines SSL may be disposed to be spaced apart from each other in the second direction DR2 over the entire display area DPA. The sensing line SSL may be disposed on the lower side of each pixel PX or sub-pixel SPXn with respect to the center thereof. The sensing line SSL may be electrically connected to the gate electrode of the third transistor T3, and may apply a sensing signal or an alignment signal to the third transistor T3.

The initialization voltage distribution line IDL may be provided in each pixel PX and may be disposed across three sub-pixels SPXn. The initialization voltage distribution line IDL may be disposed above the sensing line SSL and may have a shape extending in the first direction DR1. The initialization voltage distribution line IDL may be electrically connected to the initialization voltage line VIL to transmit an initialization voltage applied to each pixel PX to each sub-pixel SPXn. As an example, the initialization voltage distribution line IDL may be in direct contact with the initialization voltage line VIL through a contact hole CT11 (see FIG. 5). The initialization voltage distribution line IDL may be electrically connected to the drain electrode of the third transistor T3 of each sub-pixel SPXn. The initialization voltage distribution line IDL may apply the initialization voltage applied from the initialization voltage line VIL to the third transistor T3.

The scan line SCL, the sensing line SSL, and the initialization voltage distribution line IDL may be formed of a first gate conductive layer to be described later. The first gate conductive layer may further include more conductive layers in addition to the above lines.

The data lines DTL1, DTL2, and DTL3 may extend in the second direction DR2 and may be disposed across multiple sub-pixels SPXn arranged in the second direction DR2. Data lines DTL1, DTL2, and DTL3 may be disposed to be spaced apart from each other in the first direction DR1 over the entire display area DPA. Each of the data lines DTL1, DTL2, and DTL3 may be disposed to the left side of each sub-pixel SPXn. Each data line DTL1, DTL2, DTL3 transmitting a data signal to any one sub-pixel SPXn may be disposed on the right side of another sub-pixel SPXn adjacent in the first direction DR1, and each data line DTL1, DTL2, DTL3 disposed on the right side of the corresponding sub-pixel SPXn may transmit a data signal to another sub-pixel SPXn.

For example, each of the data lines DTL1, DTL2, and DTL3 may not be disposed in a region occupied by the connected sub-pixel SPXn. However, the disclosure is not limited thereto. The data lines DTL1, DTL2, and DTL3 may include a first data line DTL1 connected to the first sub-pixel SPX1, a second data line DTL2 connected to the second sub-pixel SPX2, and a third data line DTL3 connected to the third sub-pixel SPX3. Each of the data lines DTL1, DTL2, and DTL3 may be electrically connected to the drain electrode of the second transistor T2, and may apply a data signal to the second transistor T2.

The initialization voltage line VIL may extend in the second direction DR2 and may be disposed across multiple pixels PX arranged in the second direction DR2. Initialization voltage lines VIL may be disposed to be spaced apart from each other in the first direction DR1 over the entire display area DPA. The initialization voltage line VIL may be disposed in every three sub-pixels SPXn. As an example, the initialization voltage line VIL may be disposed to the left side of the data line DTL1 connected to any one sub-pixel SPXn. In the drawing, it is illustrated that the initialization voltage line VIL may be disposed to the left side of the first data line DTL1 connected to the first sub-pixel SPX1 and disposed in a region occupied by a sub-pixel SPXn adjacent in the first direction DR1, but the disclosure is not limited thereto. The initialization voltage line VIL may be electrically connected to the initialization voltage distribution line IDL to transmit the initialization voltage to each sub-pixel SPXn. The initialization voltage line VIL may be electrically connected to the drain electrode of the third transistor T3, and may apply the initialization voltage to the third transistor T3.

Each of the data lines DTL1, DTL2, and DTL3 and the initialization voltage line VIL may be formed of a first data conductive layer to be described later. The first data conductive layer may further include more conductive layers in addition to the above line and wire.

The high potential voltage lines VDL1, VDL2, and VDL3 and the low potential voltage lines VSL1, VSL2, and VSL3 may extend in the second direction DR2 and may be disposed across multiple sub-pixels SPXn adjacent in the second direction DR2. Each of the high potential voltage lines VDL1, VDL2, and VDL3 and each of the low potential voltage lines VSL1, VSL2, and VSL3 may be disposed to be spaced apart from each other in the first direction DR1 over the entire display area DPA. Each of the high potential voltage lines VDL1, VDL2, and VDL3 and each of the low potential voltage lines VSL1, VSL2, and VSL3 may be disposed between the data lines DTL1, DTL2, and DTL3 in plan view.

The high potential voltage lines VDL1, VDL2, and VDL3 may include a first high potential voltage line VDL1 connected to the first sub-pixel SPX1, a second high potential voltage line VDL2 connected to the second sub-pixel SPX2, and a third high potential voltage line VDL3 connected to the third sub-pixel SPX3. The low potential voltage lines VSL1, VSL2, and VSL3 may include a first low potential voltage line VSL1 connected to the first sub-pixel SPX1, a second low potential voltage line VSL2 connected to the second sub-pixel SPX2, and a third low potential voltage line VSL3 connected to the third sub-pixel SPX3.

For example, each of the high potential voltage lines VDL1, VDL2, and VDL3 may be disposed on the left side of each sub-pixel SPXn with respect to the center thereof, and each of the low potential voltage lines VSL1, VSL2, and VSL3 may be disposed on the right side of each sub-pixel SPXn with respect to the center thereof. However, each of the high potential voltage lines VDL1, VDL2, and VDL3 may be partially bent while extending in the second direction DR2. Each of the high potential voltage lines VDL1, VDL2, and VDL3 may include a portion bent toward the low potential voltage line VSL1, VSL2, VSL3 in addition to a portion extending from the upper side of each sub-pixel SPXn to the lower side thereof. Accordingly, a distance between the high potential voltage line VDL1, VDL2, VDL3 and the low potential voltage line VSL1, VSL2, VSL3 disposed in each sub-pixel SPXn may be partially different.

For example, in the first sub-pixel SPX1, the first high potential voltage line VDL1 may be electrically connected to the drain electrode of the first transistor T1, and may apply a first power voltage to the first transistor T1. The first low potential voltage line VSL1 may be electrically connected to the second electrode of the light emitting diode EL to apply a second power voltage to the light emitting element. Each of the high potential voltage lines VDL1, VDL2, and VDL3 and each of the low potential voltage lines VSL1, VSL2, and VSL3 may be formed of a second data conductive layer to be described later.

Figure 5:
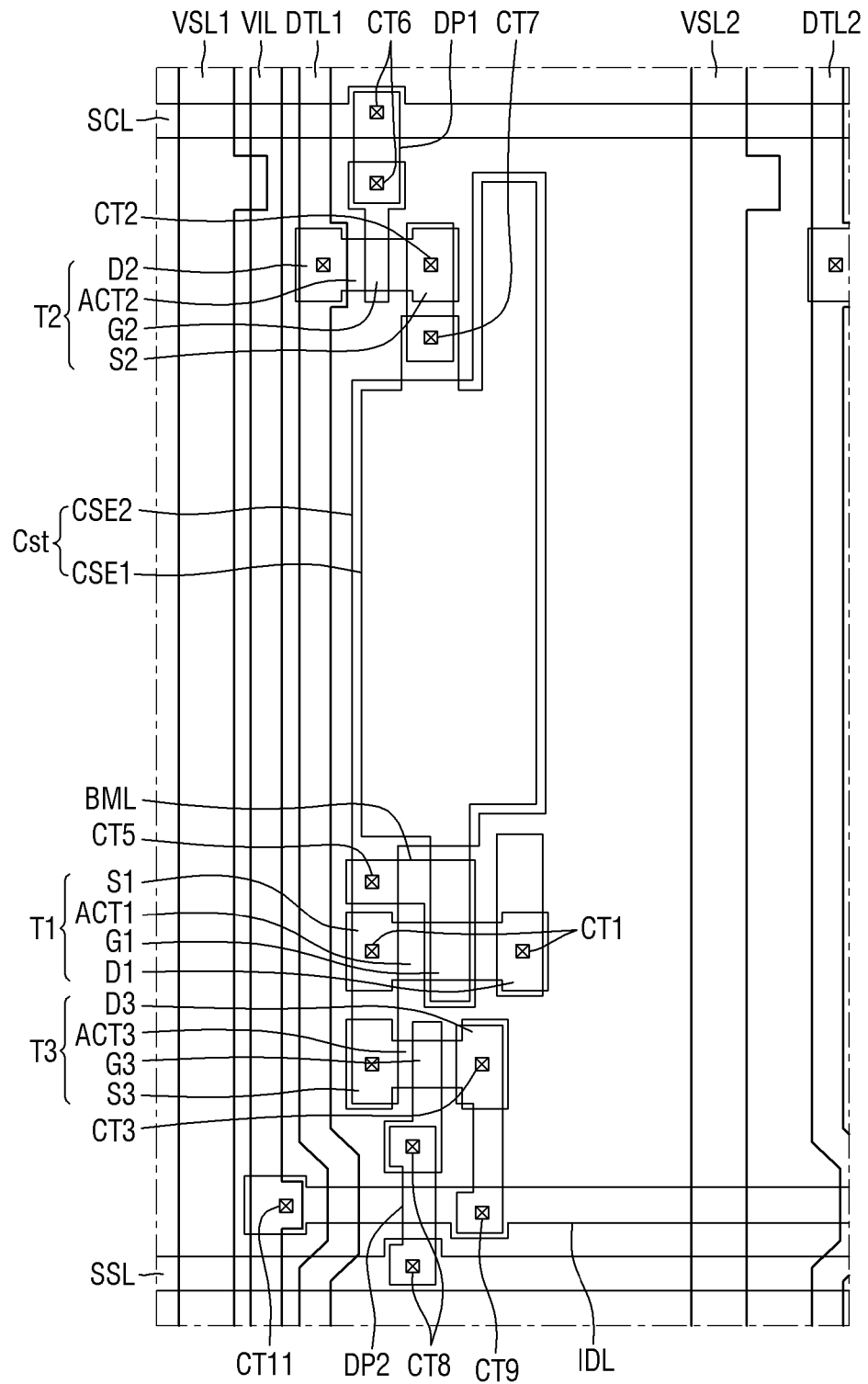
FIG. 5 is a schematic diagram illustrating conductive layers included in a sub-pixel of a display device according to an embodiment.
Figure 6:
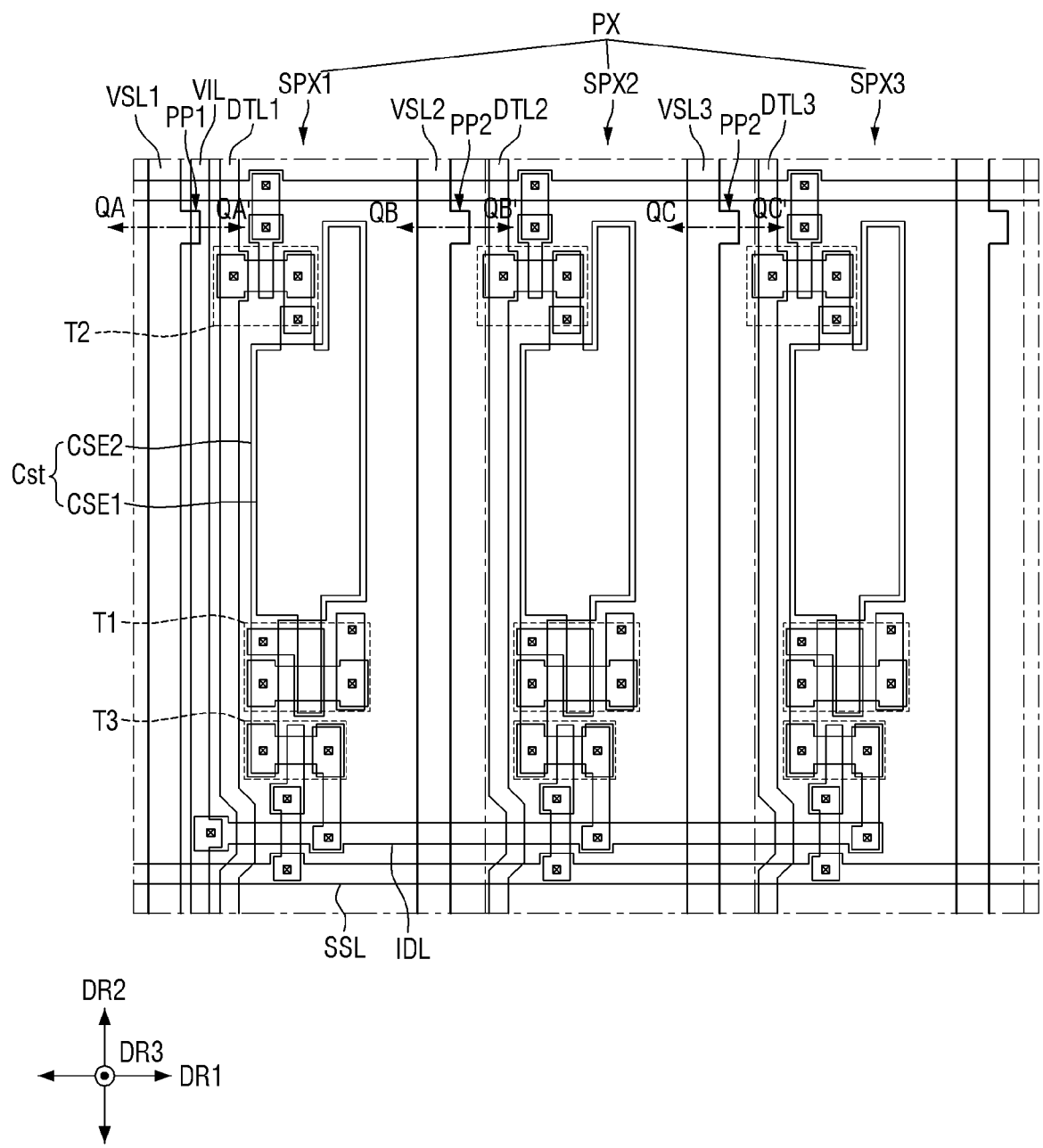
FIG. 6 is a schematic diagram illustrating conductive layers included in a pixel of a display device according to an embodiment.
Figure 7:
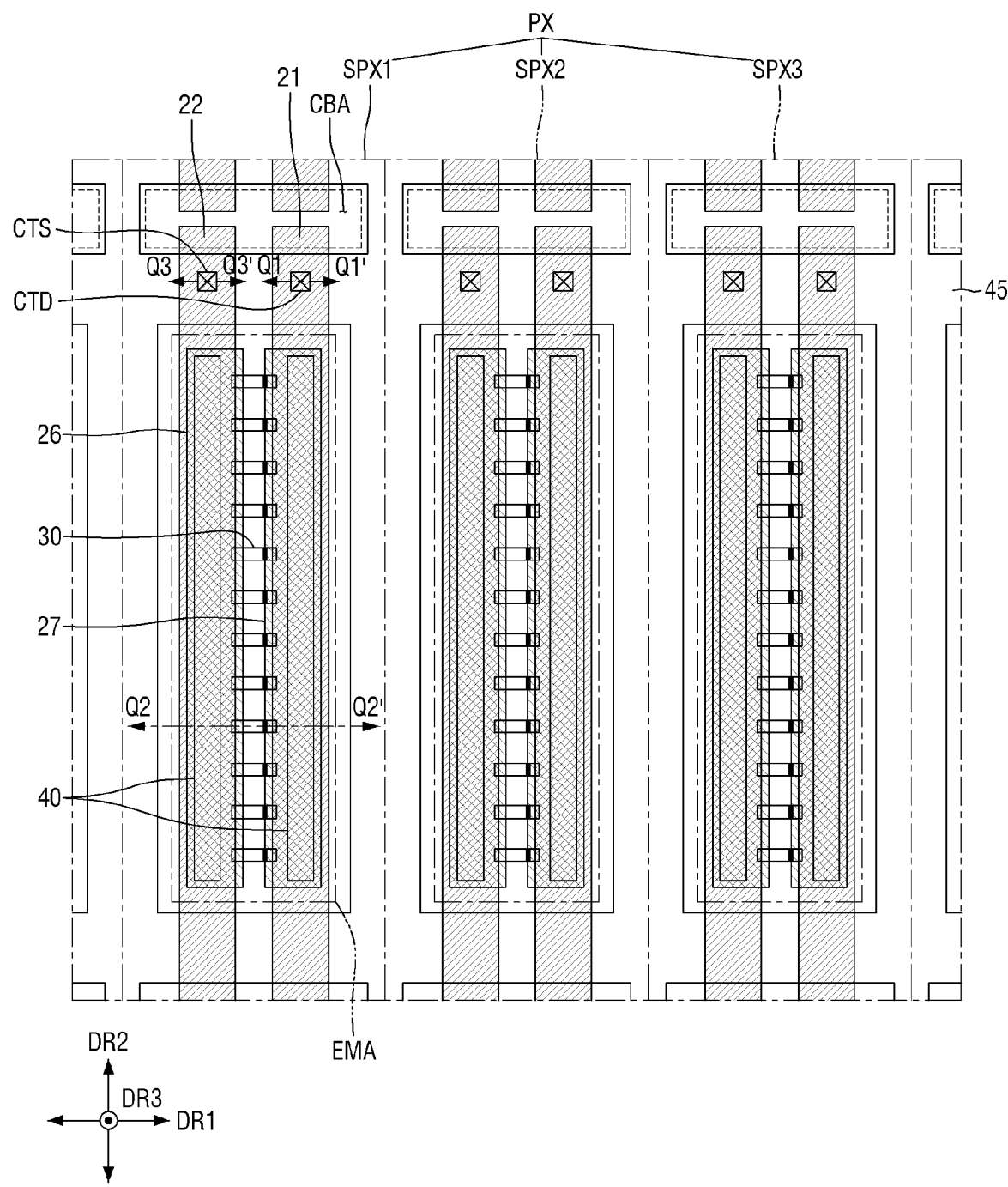
FIG. 7 is a schematic plan view illustrating electrodes and banks included in a pixel of a display device according to an embodiment.
Figure 8:
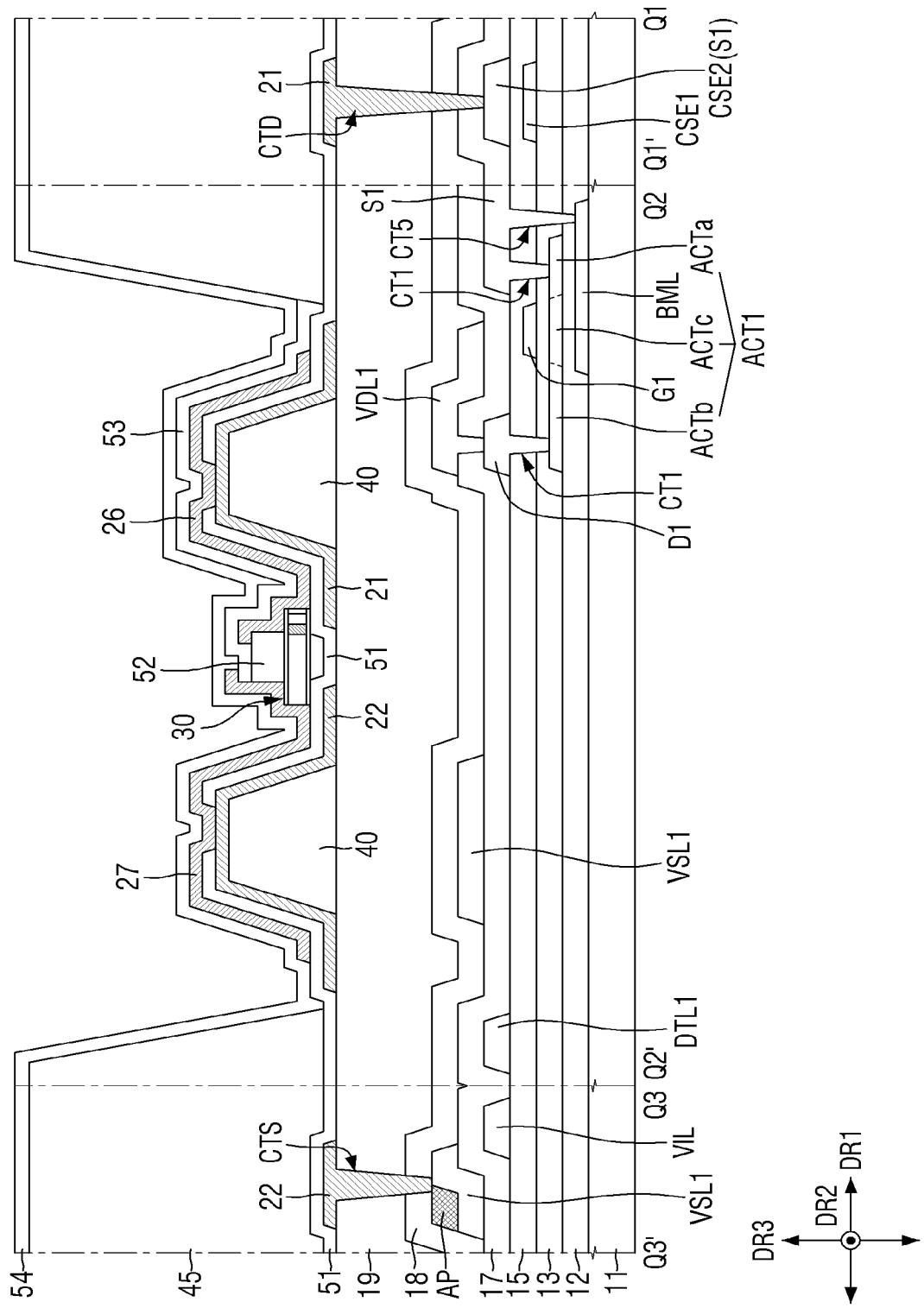
FIG. 8 is a schematic cross-sectional view taken along lines Q1-Q1', Q2-Q2', and Q3-Q3' of FIG. 7.
Figure 9:
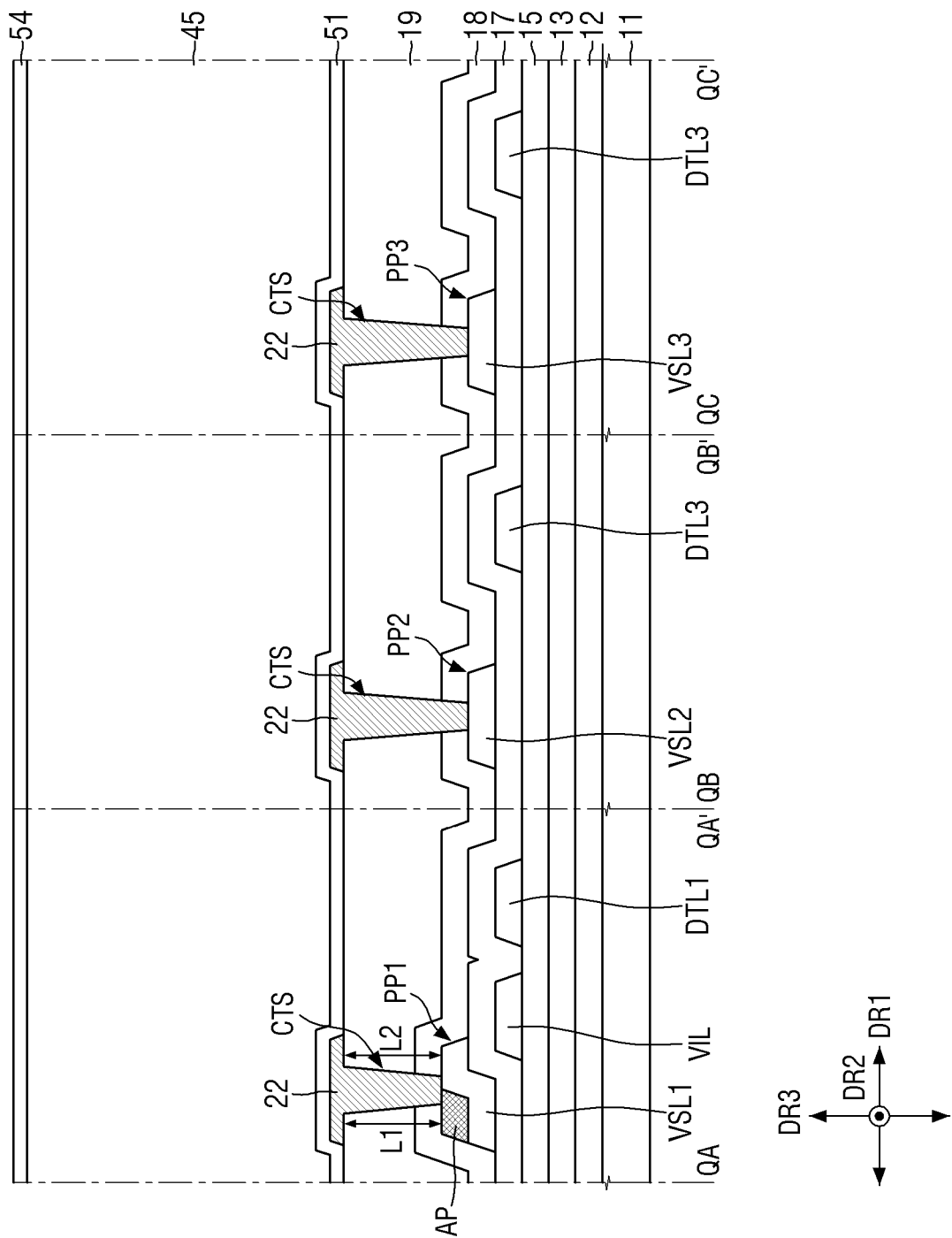
FIG. 9 is a schematic cross-sectional view taken along lines QA-QA', QB-QB', and QC-QC' of FIG. 6.
Figure 10:
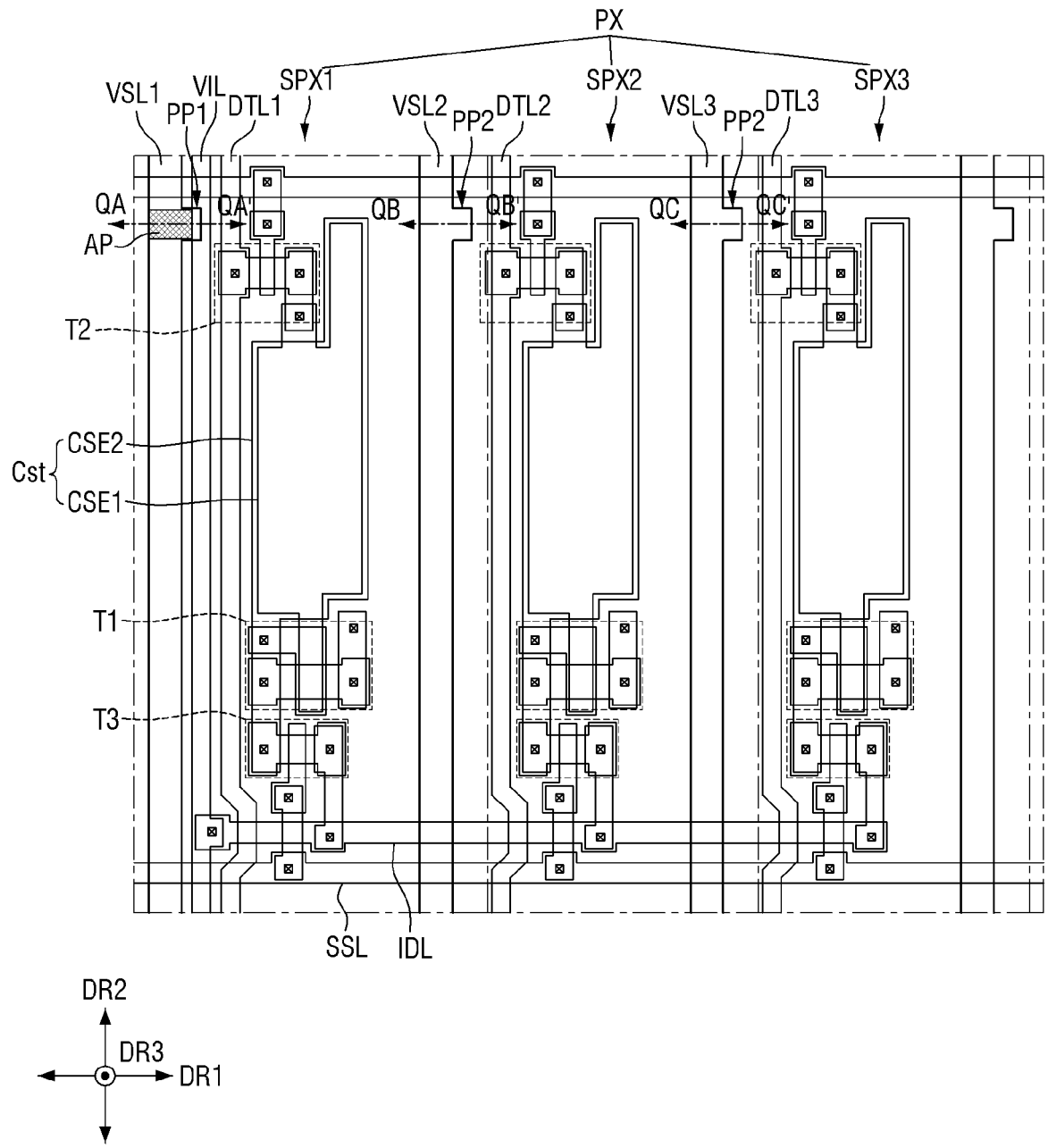
FIG. 10 is a schematic layout diagram illustrating conductive layers included in a pixel of a display device according to an embodiment.

FIG. 5 is a schematic diagram illustrating conductive layers included in a sub-pixel of a display device according to an embodiment. FIG. 6 is a schematic diagram illustrating conductive layers included in a pixel of a display device according to an embodiment. FIG. 7 is a schematic plan view illustrating electrodes and banks included in a pixel of a display device according to an embodiment. FIG. 8 is a schematic cross-sectional view taken along lines Q1-Q1', Q2-Q2', and Q3-Q3' of FIG. 7. FIG. 9 is a schematic cross-sectional view taken along lines QA-QA', QB-QB', and QC-QC' of FIG. 6. FIG. 10 is a schematic layout diagram illustrating conductive layers included in a pixel of a display device according to an embodiment.

FIG. 5 illustrates a layout diagram of conductive layers and wires and transistors connected thereto disposed in the first sub-pixel SPX1, which may be a circuit element layer disposed in each sub-pixel SPXn. FIG. 6 illustrates a layout diagram of conductive layers and wires and transistors connected thereto disposed in a pixel PX. In FIGS. 5 and 6, the high potential voltage line VDL is omitted. In FIG. 6, circuit element layers connected to the light emitting diodes EL disposed in the sub-pixels SPXn are shown separately without dividing regions occupied by the sub-pixels SPXn.

FIG. 7 illustrates the arrangement of banks 40 and 45 and contact electrodes 26 and 27, in addition to the electrodes 21 and 22 and the light emitting element 30 constituting the light emitting diode EL, which may be a display element layer disposed in each pixel PX. FIG. 8 illustrates a cross section traversing ends of the light emitting element 30 in addition to the first transistor T1. FIG. 9 illustrates a cross section of the low potential voltage line VSL, the initialization voltage line VIL, and the data line DTL.

Referring to FIGS. 5 to 9 in conjunction with FIG. 4, the display device 10 may include the circuit element layer and the display element layer. The display element layer may be a layer in which the first electrode 21 and the second electrode 22 may be disposed in addition to the light emitting element 30 of the light emitting diode EL, and the circuit element layer may be a layer in which wires may be disposed in addition to pixel circuit elements for driving the light emitting diode EL. For example, the circuit element layer may include transistors T1, T2, and T3 in addition to the scan line SCL, the sensing line SSL, the data lines DTL1, DTL2, and DTL3, the initialization voltage line VIL, the high potential voltage lines VDL1, VDL2, VDL3, the low potential voltage lines VSL1, VSL2, and VSL3.

Specifically, the display device 10 may include a substrate 11 on which the circuit element layer and the display element layer may be disposed. The substrate 11 may be an insulating substrate, and may be made of an insulating material such as glass, quartz, polymer resin, or a combination thereof. Further, the substrate 11 may be a rigid substrate, but may also be a flexible substrate which can be bent, folded or rolled.

A light blocking layer BML, may be disposed on the substrate 11. The light blocking layer BML may be disposed to overlap a first active layer ACT1 of a first transistor T1 of the display device 10. The light blocking layer BML may include a material for blocking light to prevent light from reaching the active layer ACT1 of the first transistor T1. For example, the light blocking layer BML may be formed of an opaque metal material that blocks transmission of light. However, the disclosure is not limited thereto, and in some cases, the light blocking layer BML may be omitted, and may be disposed to overlap the active layers of the other transistors T1, T2, and T3.

A buffer layer 12 may be entirely disposed on the substrate 11 including the light blocking layer BML. The buffer layer 12 may be formed on the substrate 11 to protect the transistors T1, T2, and T3 from moisture permeating through the substrate 11 susceptible to moisture permeation, and may perform a surface planarization function. The buffer layer 12 may be formed of inorganic layers that may be alternately stacked. For example, the buffer layer 12 may be formed of a multilayer in which inorganic layers including at least one of silicon oxide (SiOx), silicon nitride (SiNx) or silicon oxynitride (SiON) may be alternately stacked.

The semiconductor layer may be disposed on the buffer layer 12. The semiconductor layer may include active layers ACT1, ACT2, and ACT3 of the respective transistors T1, T2, and T3. The first active layer ACT1 of the first transistor T1 may be disposed adjacent to and below the center of each sub-pixel SPXn. A second active layer ACT2 of the second transistor T2 may be disposed above the center of each sub-pixel SPXn, and a third active layer ACT3 of the third transistor T3 may be disposed below the first active layer ACT1.

In an embodiment, the semiconductor layer may include polycrystalline silicon, monocrystalline silicon, oxide semiconductor, or the like. The polycrystalline silicon may be formed by crystallizing amorphous silicon. In case that the semiconductor layer includes the oxide semiconductor, each of the active layers ACT1, ACT2, and ACT3 may include conductive regions ACTa and ACTb and a channel region ACTc between them. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like.

In another embodiment, the semiconductor layer may include polycrystalline silicon. The polycrystalline silicon may be formed by crystallizing amorphous silicon and, the conductive region of the active layers ACT1, ACT2, and ACT3 may be a region doped with impurities. However, the disclosure is not limited thereto.

The first gate insulating layer 13 may be disposed on the semiconductor layer and the buffer layer 12. The first gate insulating layer 13 may be disposed on the buffer layer 12 including the semiconductor layer. The first gate insulating layer 13 may function as a gate insulating layer of each transistor. The first gate insulating layer 13 may be formed of an inorganic layer including an inorganic material, such as silicon oxide (SiOx), silicon nitride (SiNx), silicon oxynitride (SiON), or a stacked structure thereof.

The first gate conductive layer may be disposed on the first gate insulating layer 13. The first gate conductive layer may include gate electrodes G1, G2, and G3 of the transistors T1, T2, and T3, the scan line SCL, the sensing line SSL, the initialization voltage distribution line IDL, and a first capacitance electrode CSE1 of the storage capacitor. Since the description of the scan line SCL, the sensing line SSL, and the initialization voltage distribution line IDL may be the same as that described above, the gate electrodes and the first capacitance electrode CSE1 will be described below.

The gate electrodes G1, G2, and G3 of the first gate conductive layer may be disposed to partially overlap the active layers of the transistors T1, T2, and T3, respectively. For example, a first gate electrode G1 of the first transistor T1 may be disposed to partially overlap the first active layer ACT1. The first gate electrode G1 may be connected to the first capacitance electrode CSE1 of the storage capacitor to be described later and integrally formed therewith.

A second gate electrode G2 of the second transistor T2 may be disposed to partially overlap the second active layer ACT2, and a third gate electrode G3 of the third transistor T3 may be disposed to partially overlap the third active layer ACT3. The second gate electrode G2 may be electrically connected to the scan line SCL, and a scan signal may be applied to the second transistor T2. The third gate electrode G3 may be electrically connected to the sensing line SSL, and a sensing signal or an alignment signal may be applied to the gate electrode of the third transistor T3.

The first capacitance electrode CSE1 of the storage capacitor Cst may be disposed between the scan line SCL and the sensing line SSL. The first capacitance electrode CSE1 may be electrically connected to the first gate electrode G1 of the first transistor T1 and the source electrode of the second transistor T2. As an example, the first capacitance electrode CSE1 may be formed integrally with the first gate electrode G1, and may be connected to the source electrode of the second transistor T2 through a contact hole CT7.

The first gate conductive layer may be formed as a single layer or multiple layers made of at least one of molybdenum (Mo), aluminum (Al), chromium (Cr), gold (Au), titanium (T1), nickel (Ni), neodymium (Nd) and copper (Cu) or an alloy thereof. However, the disclosure is not limited thereto.

The first protective layer 15 may be disposed on the first gate conductive layer. The first protective layer 15 may be disposed to cover (e.g., overlap) the first gate conductive layer to function to protect it. The first protective layer 15 may be formed of an inorganic layer including an inorganic material, such as silicon oxide (SiOx), silicon nitride (SiNx), silicon oxynitride (SiON), or a stacked structure thereof.

The first data conductive layer may be disposed on the first protective layer 15. The first data conductive layer may include the source and drain electrodes of the transistors T1, T2 and T3, the first data line DTL1, the initialization voltage line VIL, a second capacitance electrode CSE2 of the storage capacitor, and conductive patterns DP1 and DP2. Since the description of the first data line DTL and the initialization voltage line VIL may be the same as that described above, the source and drain electrodes, the second capacitance electrode CSE2, and the conductive patterns will be described below.

A first source electrode S1 and a first drain electrode D1 of the first transistor T1 may be disposed to partially overlap the first active layer ACT1. The first source electrode S1 and the first drain electrode D1 may each be in contact with the first active layer ACT1 through a contact hole CT1 penetrating the first protective layer 15 and the first gate insulating layer 13. The first source electrode S1 may be in contact with the light blocking layer BML through a contact hole CT5 penetrating the first protective layer 15, the first gate insulating layer 13, and the buffer layer 12. The first drain electrode D1 may be electrically connected to the first high potential voltage line VDL1, and the first source electrode S1 may be connected to the second capacitance electrode CSE2 of the storage capacitor connected to the first electrode 21 of the light emitting diode EL. As an example, the first drain electrode D1 may be in direct contact with the first high potential voltage line VDL1 through a contact hole, and the first source electrode S1 may be integrally connected to the second capacitance electrode CSE2. The first transistor T1 may be turned on in response to a data signal transmitted from the third transistor T3 to transmit the first power voltage to the first electrode 21.

A second source electrode S2 and a second drain electrode D2 of the second transistor T2 may be disposed to partially overlap the second active layer ACT2. The second source electrode S2 and the second drain electrode D2 may each be in contact with the second active layer ACT2 through a contact hole CT2 penetrating the first protective layer 15 and the first gate insulating layer 13. The second drain electrode D2 may be integrally connected to the first data line DTL1, and the second source electrode S2 may be in contact with the first capacitance electrode CSE1 through a contact hole CT7 penetrating the first protective layer 15. The second transistor T2 may be turned on in response to a scan signal to transmit a data signal applied from the first data line DTL1 to the first gate electrode G1 of the first transistor T1.

A third source electrode S3 and a third drain electrode D3 of the third transistor T3 may be disposed to partially overlap the third active layer ACT3. The third source electrode S3 and the third drain electrode D3 may each be in contact with the third active layer ACT3 through a contact hole CT3 penetrating the first protective layer 15 and the first gate insulating layer 13. The third drain electrode D3 may be in contact with the initialization voltage distribution line IDL through a contact hole CT9 penetrating the first protective layer 15, and the third source electrode S3 may be connected to the second capacitance electrode CSE2 of the storage capacitor. As an example, the third source electrode S3 may be integrally connected to the second capacitance electrode CSE2. The initialization voltage distribution line IDL may be connected to the initialization voltage line VIL through the contact hole CT11 penetrating the first protective layer 15 to receive an initialization voltage, and the initialization voltage may be transmitted to the third drain electrode D3. The third transistor T3 may be turned on in response to a sensing signal to transmit the initialization voltage to the first electrode 21 of the light emitting diode EL through the second capacitance electrode CSE2.

The second capacitance electrode CSE2 of the storage capacitor Cst may be disposed to overlap the first capacitance electrode CSE1. The second capacitance electrode CSE2 may be integrally connected to the first source electrode S1 of the first transistor T1 and the third source electrode S3 of the third transistor T3. As will be described later, the second capacitance electrode CSE2 may be electrically connected to the first electrode 21 of the light emitting diode EL through an electrode contact hole CTD penetrating the insulating layers disposed on the second capacitance electrode CSE2. Although it is illustrated that the second capacitance electrode CSE2 may be in direct contact with the first electrode 21 in the drawing, the disclosure is not limited thereto. In some embodiments, the second capacitance electrode CSE2 may be electrically connected to the first electrode 21 through an electrode formed of a conductive layer disposed thereon.

A first conductive pattern DP1 may be disposed to overlap the scan line SCL and the second gate electrode G2. The first conductive pattern DP1 may be in contact with the scan line SCL and the second gate electrode G2 through a contact hole CT6 penetrating the first protective layer 15. The second gate electrode G2 may be electrically connected to the scan line SCL through the first conductive pattern DP1. A second conductive pattern DP2 may be disposed to overlap the sensing line SSL and the third gate electrode G3. The second conductive pattern DP2 may be in contact with the sensing line SSL and the third gate electrode G3 through a contact hole CT8 penetrating the first protective layer 15. The third gate electrode G3 may be electrically connected to the sensing line SSL through the second conductive pattern DP2.

The first data conductive layer may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The first interlayer insulating layer 17 may be disposed on the first data conductive layer. The first interlayer insulating layer 17 may function as an insulating film between the first data conductive layer and other layers disposed thereon. The first interlayer insulating layer 17 may cover the first data conductive layer and function to protect the first data conductive layer. The first interlayer insulating layer 17 may be formed of an inorganic layer including an inorganic material, such as silicon oxide (SiOx), silicon nitride (SiNx), silicon oxynitride (SiON), or a stacked structure thereof.

The second data conductive layer may be disposed on the first interlayer insulating layer 17. The second data conductive layer may include the first high potential voltage line VDL1 and the first low potential voltage line VSL1. However, the disclosure is not limited thereto, and the second data conductive layer may further include conductive patterns. The first high potential voltage line VDL1 may be electrically connected to the first drain electrode D1 of the first transistor T1 through a contact hole penetrating the first interlayer insulating layer 17. The first power voltage applied to the first high potential voltage line VDL1 may be transmitted to the first electrode 21 of the light emitting diode EL through the first transistor T1. The first low potential voltage line VSL1 may be electrically connected to the second electrode 22 of the light emitting diode EL, and may transmit the second power voltage to the second electrode 22. Since the description of the first high potential voltage line VDL1 and the first low potential voltage line VSL1 may be the same as that described above, detailed descriptions thereof will be omitted.

The second data conductive layer may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The second interlayer insulating layer 18 may be disposed on the second data conductive layer. The second interlayer insulating layer 18 may function as an insulating layer between the second data conductive layer and other layers disposed thereon. The second interlayer insulating layer 18 may cover the second data conductive layer and function to protect the second data conductive layer. The second interlayer insulating layer 18 may be formed of an inorganic layer including an inorganic material, such as silicon oxide (SiOx), silicon nitride (SiNx), silicon oxynitride (SiON), or a stacked structure thereof.

A first planarization layer 19 may be disposed on the second interlayer insulating layer 18. The first planarization layer 19 may include an organic insulating material, for example, an organic material such as polyimide (PI), to perform a surface planarization function.

First banks 40, the electrodes 21 and 22, the light emitting element 30, the second bank 45 and contact electrodes 26 and 27 may be disposed on the first planarization layer 19. Insulating layers 51, 52, 53 and 54 may be further disposed on the first planarization layer 19.

The first banks 40 may be directly disposed on the first planarization layer 19. The first banks 40 may extend in the second direction DR2 in each sub-pixel SPXn, but may be disposed within the emission area EMA so as not to extend to other sub-pixels SPXn adjacent in the second direction DR2. The first banks 40 may be disposed to be spaced apart from each other in the first direction DR1, and a region having the light emitting elements 30 may be formed in a space therebetween. The first banks 40 may be disposed for each sub-pixel SPXn to form a linear pattern in the display area DPA of the display device 10. In the drawing, two first banks 40 are illustrated, but the disclosure is not limited thereto. A larger number of first banks 40 may be further arranged according to the number of electrodes 21 and 22 to be described later.

The first bank 40 may have a structure in which at least a portion thereof protrudes from the top surface of the first planarization layer 19. The protruding portion of the first bank 40 may have an inclined side surface, and light emitted from the light emitting element 30 may proceed toward the inclined side surface of the first bank 40. The electrodes 21 and 22 disposed on the first bank 40 may include a material having high reflectivity, and the light emitted from the light emitting element 30 may be reflected from the electrodes 21 and 22 disposed on the side surface of the first bank 40 to be emitted in the upward direction of the first planarization layer 19. For example, the first bank 40 may provide a region in which the light emitting elements 30 may be disposed, and may also function as a reflective partition wall that reflects light emitted from the light emitting elements 30 upward. The side surface of the first bank 40 may be inclined in a linear shape, but is not limited thereto, and the outer surface of the first bank 40 may have a curved semi-circle or semi-ellipse shape. In an embodiment, the first banks 40 may include an organic insulating material such as polyimide (PI), but are not limited thereto.

The electrodes 21 and 22 may be disposed on the first bank 40 and the first planarization layer 19. The electrodes 21 and 22 may include a first electrode 21 and a second electrode 22. The first electrode 21 and the second electrode 22 may extend in the second direction DR2, and may be disposed to be spaced apart from each other in the first direction DR1.

Each of the first electrode 21 and the second electrode 22 may extend in the second direction DR2 within the sub-pixel SPXn, but may be separated from the other electrodes 21 and 22 in the sub-region CBA. In some embodiments, the sub-region CBA may be disposed between the emission areas EMA of the sub-pixels SPXn adjacent in the second direction DR2, and the first electrode 21 and the second electrode 22 may be separated from the other first electrode 21 and second electrode 22 disposed in the sub-pixel SPXn adjacent in the second direction DR2 in the sub-region CBA. However, the disclosure is not limited thereto, and some of the electrodes 21 and 22 may be arranged to extend beyond the adjacent sub-pixel SPXn in the second direction DR2 without being separated for each sub-pixel SPXn, or only one of the first electrode 21 and the second electrode 22 may be separated.

The first electrode 21 may be electrically connected to the first transistor T1 and the third transistor T3, and the second electrode 22 may be electrically connected to the first low potential voltage line VSL1. For example, the first electrode 21 may be in contact with the first source electrode S1 or the second capacitance electrode CSE2 through a first electrode contact hole CTD penetrating the first planarization layer 19, the second interlayer insulating layer 18, and the first interlayer insulating layer 17. The second electrode 22 may be connected to the first low potential voltage line VSL1 through a second electrode contact hole CTS penetrating the first planarization layer 19, the second interlayer insulating layer 18, and the first interlayer insulating layer 17. For example, the first electrode 21 and the second electrode 22 may overlap a part of the second bank 45 extending in the first direction DR1, and the first electrode contact hole CTD and the second electrode contact hole CTS may be formed in a region where the electrodes 21 and 22 overlap the second bank 45. The first electrode 21 and the second electrode 22 may each be in contact with an electrode conductive pattern disposed on the second data conductive layer, and the positions of the electrode contact holes CTD and CTS may vary depending on the arrangement of the electrode conductive pattern. For example, all of the electrode contact holes CTD and CTS may be formed in the emission area EMA.

Although it is illustrated in the drawing that one first electrode 21 and one second electrode 22 may be disposed for each sub-pixel SPXn, the disclosure is not limited thereto. In some embodiments, a larger number of the first electrodes 21 and the second electrodes 22 may be disposed for each sub-pixel SPXn. The first electrode 21 and the second electrode 22 disposed in each sub-pixel SPXn may not necessarily have a shape extending in a direction, and the first electrode 21 and the second electrode 22 may be arranged in various structures. For example, the first electrode 21 and the second electrode 22 may have a partially curved or bent shape, and one electrode may be disposed to surround the other electrode.

The first electrode 21 and the second electrode 22 may be respectively disposed on the first banks 40. In some embodiments, the first electrode 21 and the second electrode 22 may each be formed to have a width larger than that of the first bank 40. For example, each of the first electrode 21 and the second electrode 22 may be disposed to cover the outer surface of the first bank 40. The first electrode 21 and the second electrode 22 may be disposed on the side surfaces of the first bank 40, respectively, and the distance between the first electrode 21 and the second electrode 22 may be smaller than the distance between the first banks 40. Further, at least a part of the first electrode 21 and at least a part of the second electrode 22 may be directly disposed on the first planarization layer 19.

Each electrode 21, 22 may include a conductive material having high reflectivity. For example, each electrode 21, 22 may include a metal such as silver (Ag), copper (Cu), aluminum (Al), or a combination thereof as a material having high reflectivity, or may be an alloy including aluminum (Al), nickel (Ni), lanthanum (La), and the like. Each electrode 21, 22 may reflect, in the upward direction of each sub-pixel SPXn, light emitted from the light emitting element 30 and traveling to the side surface of the first bank 40.

However, the disclosure is not limited thereto, and each of the electrodes 21 and 22 may further include a transparent conductive material. For example, each electrode 21, 22 may include a material such as indium tin oxide (ITO), indium zinc oxide (IZO), indium tin zinc oxide (ITZO), or a combination thereof. In some embodiments, each of the electrodes 21 and 22 may have a structure in which at least one transparent conductive material and at least one metal layer having high reflectivity may be stacked, or may be formed as one layer including them. For example, each electrode 21, 22 may have a stacked structure such as ITO/silver (Ag)/ITO, ITO/Ag/IZO, or ITO/Ag/ITZO/IZO.

The electrodes 21 and 22 may be electrically connected to the light emitting elements 30 and may be applied with a voltage to allow the light emitting elements 30 to emit light. For example, the electrodes 21 and 22 may be electrically connected to the light emitting elements 30 through the contact electrodes 26 and 27 to be described later, and the electrical signals applied to the electrodes 21 and 22 may be transferred to the light emitting elements 30 through the contact electrodes 26 and 27.

In an embodiment, one of the first electrode 21 and the second electrode 22 may be electrically connected to an anode electrode of the light emitting element 30, and the other one thereof may be electrically connected to a cathode electrode of the light emitting element 30. However, the disclosure is not limited thereto, and an opposite case may also be possible.

Further, each of the electrodes 21 and 22 may be used to form an electric field in the sub-pixel SPXn to align the light emitting elements 30. The light emitting elements 30 may be disposed between the first electrode 21 and the second electrode 22 by an electric field formed on the first electrode 21 and the second electrode 22. In an embodiment, the light emitting elements 30 of the display device 10 may be injected onto the electrodes 21 and 22 through an inkjet printing process. In case that inks including the light emitting elements 30 are injected onto the electrodes 21 and 22, an alignment signal may be applied to the electrodes 21 and 22 to generate an electric field. The light emitting elements 30 dispersed in the inks may be aligned on the electrodes 21 and 22 by the electric field generated on the electrodes 21 and 22.

A first insulating layer 51 may be disposed on the first planarization layer 19, the first electrode 21, and the second electrode 22. The first insulating layer 51 may be disposed to partially cover the first electrode 21 and the second electrode 22 while covering a region between the first electrode 21 and the second electrode 22. For example, the first insulating layer 51 may be disposed to cover most of the top surfaces of the first and second electrodes 21 and 22, while exposing a part of the first electrode 21 and a part of the second electrode 22. In other words, the first insulating layer 51 may be substantially entirely formed on the first planarization layer 19, and may include an opening (not shown) exposing a part of the first electrode 21 and a part of the second electrode 22.

In an embodiment, the first insulating layer 51 may be formed to have a step such that a portion of the top surface thereof may be recessed between the first electrode 21 and the second electrode 22. However, the disclosure is not limited thereto. The first insulating layer 51 may form a flat top surface such that the light emitting element 30 may be disposed thereon.

The first insulating layer 51 may protect the first electrode 21 and the second electrode 22 while insulating them from each other. Further, it may be possible to prevent the light emitting element 30 disposed on the first insulating layer 51 from being damaged by direct contact with other members. However, the shape and structure of the first insulating layer 51 are not limited thereto.

The second bank 45 may be disposed on the first insulating layer 51. The second bank 45 may include portions extending in the first direction DR1 and the second direction DR2 in plan view to be arranged in a grid pattern over the entire surface of the display area DPA. The second bank 45 may be disposed across the boundary of each sub-pixel SPXn to delimit neighboring sub-pixels SPXn. Further, according to an embodiment, the second bank 45 may be formed to have a height greater than that of the first bank 40. The second bank 45 may function to prevent inks from overflowing to adjacent sub-pixels SPXn during the inkjet printing process in the manufacturing process of the display device 10. The second bank 45 may separate inks in which different light emitting elements 30 may be dispersed for different sub-pixels SPXn so as not to be mixed with each other.

The second bank 45 may also be arranged to surround the emission area EMA and the sub-region CBA disposed for each sub-pixel SPXn to delimit them from each other. The first electrode 21 and the second electrode 22 may extend in the second direction DR2 to be disposed across a portion of the second bank 45 extending in the first direction DR1. In a portion extending in the second direction DR2 of the second bank 45, a portion disposed between the emission areas EMA may have a larger width than a portion disposed between the sub-regions CBA. Accordingly, the distance between the sub-regions CBA may be smaller than the distance between the emission areas EMA. Similarly to the first bank 40, the second bank 45 may include polyimide (PI), but is not limited thereto.

A light emitting element 30 may be disposed on the first insulating layer 51. The light emitting elements 30 may be disposed to be spaced apart from each other along the second direction DR2 in which the electrodes 21 and 22 extend, and may be aligned substantially parallel to each other. The distance between the light emitting elements 30 is not particularly limited. The light emitting element 30 may have a shape extending in a direction, and the extending direction of the light emitting element 30 may be substantially perpendicular to the extending direction of the electrodes 21 and 22. However, the disclosure is not limited thereto, and the light emitting element 30 may be disposed obliquely without being perpendicular to the extension direction of the electrodes 21 and 22.

The light emitting element 30 may include a light emitting layer 36 including a different material to emit light of a different wavelength band to the outside. The display device 10 may include the light emitting elements 30 that emit light of different wavelength bands. Accordingly, light of the first color, light of the second color, and light of the third color may be emitted from the first sub-pixel SPX1, the second sub-pixel SPX2, and the third sub-pixel SPX3, respectively. However, the disclosure is not limited thereto. In some cases, each of the sub-pixels SPXn may include the light emitting element 30 of the same type to emit light of substantially the same color.

Further, between the first banks 40, the light emitting element 30 may have ends respectively disposed above the electrodes 21 and 22. For example, the light emitting element 30 may be disposed such that one end may be placed above the first electrode 21 and the other end may be placed above the second electrode 22. The extension length of the light emitting element 30 may be longer than the distance between the first electrode 21 and the second electrode 22, and ends of the light emitting element 30 may be respectively disposed above the first electrode 21 and the second electrode 22.

The light emitting element 30 may be provided with multiple layers disposed in a direction perpendicular to the top surface of the substrate 11 or the first planarization layer 19. The light emitting element 30 of the display device 10 may be disposed such that an extending direction may be parallel to the first planarization layer 19, and the semiconductor layers included in the light emitting element 30 may be sequentially arranged along a direction parallel to the top surface of the first planarization layer 19. However, the disclosure is not limited thereto. In some cases, in case that the light emitting element 30 has a different structure, layers may be arranged in a direction perpendicular to the first planarization layer 19.

Further, ends of the light emitting element 30 may be in contact with the contact electrodes 26 and 27, respectively. According to an embodiment, since, on an end surface of the light emitting element 30 in its extension direction, an insulating film 38 may not be formed and a part of the semiconductor layer may be exposed, the exposed semiconductor layer may be in contact with the contact electrodes 26 and 27. However, the disclosure is not limited thereto. In some cases, in the light emitting element 30, at least a part of the insulating film 38 may be removed, and the insulating film 38 may be removed, so that the side surfaces at ends of the semiconductor layers may be partially exposed. The side surfaces of the exposed semiconductor layer may be in direct contact with the contact electrodes 26 and 27.

The second insulating layer 52 may be partially disposed on the light emitting element 30. For example, the second insulating layer 52 may be disposed to partially surround the outer surface of the light emitting element 30 so as not to cover ends of the light emitting element 30. The contact electrodes 26 and 27 to be described later may be in contact with ends of the light emitting element 30 that may not be covered by the second insulating layer 52. The portion of the second insulating layer 52 disposed on the light emitting element 30 may be arranged to extend in the second direction DR2 on the first insulating layer 51 in plan view, so that it may form a linear or island-like pattern in each sub-pixel SPXn. The second insulating layer 52 may protect the light emitting element 30 while fixing the light emitting element 30 during the manufacturing process of the display device 10.

The contact electrodes 26 and 27 and a third insulating layer 53 may be disposed on the second insulating layer 52.

The contact electrodes 26 and 27 may have a shape extending in a direction. A first contact electrode 26 and a second contact electrode 27 of the contact electrodes 26 and 27 may be disposed on a portion of the first electrode 21 and a portion of the second electrode 22, respectively. The first contact electrode 26 may be disposed on the first electrode 21, and the second contact electrode 27 may be disposed on the second electrode 22. The first contact electrode 26 and the second contact electrode 27 may each have a shape extending in the second direction DR2. The first contact electrode 26 and the second contact electrode 27 may be spaced apart from each other in the first direction DR1, and they may form a stripe pattern in the emission area EMA of each sub-pixel SPXn.

In some embodiments, the widths of the first contact electrode 26 and the second contact electrode 27 measured in a direction may be equal to or smaller than the widths of the first electrode 21 and the second electrode 22 measured in the direction, respectively. The first contact electrode 26 and the second contact electrode 27 may be disposed not only to contact an end and the other end of the light emitting element 30, respectively, but also to cover a portion of the top surface of the first electrode 21 and a portion of the top surface of the second electrode 22, respectively.

The contact electrodes 26 and 27 may be in contact with the light emitting element 30 and the electrodes 21 and 22. In the light emitting element 30, the semiconductor layer may be exposed on both end surfaces of the light emitting element 30 in its extension direction, and the first contact electrode 26 and the second contact electrode 27 may be in contact with the end surfaces of the light emitting element 30 on which the semiconductor layer has been exposed. An end of the light emitting element 30 may be electrically connected to the first electrode 21 through the first contact electrode 26, and the other end thereof may be electrically connected to the second electrode 22 through the second contact electrode 27.

Although one first contact electrode 26 and one second contact electrode 27 may be disposed in a sub-pixel SPXn in the drawing, the disclosure is not limited thereto. The number of the first contact electrodes 26 and the second contact electrodes 27 may vary depending on the number of the first electrodes 21 and the second electrodes 22 disposed in each sub-pixel SPXn.

A third insulating layer 53 may be disposed on the first contact electrode 26. The third insulating layer 53 may electrically insulate the first contact electrode 26 and the second contact electrode 27 from each other. The third insulating layer 53 may be disposed to cover the first contact electrode 26, but may not be disposed on the other end of the light emitting element 30 such that the light emitting element 30 can be brought into contact with the second contact electrode 27. The third insulating layer 53 may partially contact the first contact electrode 26 and the second insulating layer 52 on the top surface of the second insulating layer 52. The side surface of the third insulating layer 53 in a direction in which the second electrode 22 may be disposed may be aligned with a side surface of the second insulating layer 52. The third insulating layer 53 may be disposed in the non-emission area, e.g., on the first insulating layer 51 disposed on the first planarization layer 19. However, the disclosure is not limited thereto.

The second contact electrode 27 may be disposed on the second electrode 22, the second insulating layer 52, and the third insulating layer 53. The second contact electrode 27 may be in contact with the other end of the light emitting element 30 and the exposed top surface of the second electrode 22. The other end of the light emitting element 30 may be electrically connected to the second electrode 22 through the second contact electrode 27.

The second contact electrode 27 may be partially in contact with the second insulating layer 52, the third insulating layer 53, the second electrode 22, and the light emitting element 30. The first contact electrode 26 and the second contact electrode 27 may not be in contact with each other by the second insulating layer 52 and the third insulating layer 53. However, the disclosure is not limited thereto, and in some cases, the third insulating layer 53 may be omitted.

The contact electrodes 26 and 27 may include a conductive material. For example, they may include at least one of ITO, IZO, ITZO, aluminum (Al), or the like. As an example, the contact electrodes 26 and 27 may include a transparent conductive material, and light emitted from the light emitting element 30 may pass through the contact electrodes 26 and 27 and proceed toward the electrodes 21 and 22. However, the disclosure is not limited thereto.

A fourth insulating layer 54 may be entirely disposed on the substrate 11. The fourth insulating layer 54 may function to protect members disposed on the substrate 11 from external environments.

Each of the first insulating layer 51, the second insulating layer 52, the third insulating layer 53, and the fourth insulating layer 54 may include an inorganic insulating material or an organic insulating material. In an embodiment, the first insulating layer 51, the second insulating layer 52, the third insulating layer 53, and the fourth insulating layer 54 may include an inorganic insulating material such as silicon oxide (SiOx), silicon nitride (SiNx), silicon oxynitride (SiOxNy), aluminum oxide (Al2O3), aluminum nitride (AlN), and the like, or a combination thereof. In other embodiments, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like, or a combination thereof. However, the disclosure is not limited thereto.

In the above-described display device 10, while the display device 10 may be driven, a driving signal may be transmitted from the first electrode 21 and the second electrode 22 to the light emitting element 30, so that the light emitting element 30 may emit light. During driving of the display device 10 or in a driving mode of the display device 10, the first power voltage may be transmitted to the first electrode 21 through the first transistor T1, and the second power voltage may be transmitted to the second electrode 22 through the first low potential voltage line VSL1. A data signal may be applied to the first gate electrode G1 of the first transistor T1 through the second transistor T2, and an initialization voltage may be transmitted to the first source electrode S1 or the first electrode 21 through the third transistor T3.

As shown in FIGS. 6 and 9, the initialization voltage line VIL may be disposed in every three sub-pixels SPXn. For example, the initialization voltage line VIL may be disposed in the first sub-pixel SPX1 and may not be disposed in the second sub-pixel SPX2 and the third sub-pixel SPX3. The initialization voltage line VIL disposed in the first sub-pixel SPX1 may be electrically connected to the initialization voltage distribution line IDL, and the initialization voltage distribution line IDL may be connected to the second sub-pixel SPX2 and the third sub-pixel SPX3.

The first low potential voltage line VSL1, the initialization voltage line VIL and the first data line DTL1 may be disposed on a side of the first sub-pixel SPX1. The second low potential voltage line VSL2 and the second data line DTL2 may be disposed on a side of the second sub-pixel SPX2. The third low potential voltage line VSL3 and the third data line DTL3 may be disposed on a side of the third sub-pixel SPX3. The initialization voltage line VIL may be disposed between the first low potential voltage line VSL1 and the first data line DTL1 in the first sub-pixel SPX1, and may not be disposed between the second low potential voltage line VSL2 and the second data line DTL2 in the second sub-pixel SPX2 and between the third low potential voltage line VSL3 and the third data line DTL3 in the third sub-pixel SPX3.

On the low potential voltage line VSL1, VSL2, VSL3 of each sub-pixel SPXn, the second electrode contact hole CTS for connecting it to the second electrode 22 may be disposed. The low potential voltage line VSL1, VSL2, VSL3 of each sub-pixel SPXn may include a protrusion PP1, PP2, PP3 protruding toward the data line DTL1, DTL2, DTL3 for the region occupied by the second electrode contact hole CTS.

For example, a first protrusion PP1 of the first low potential voltage line VSL1 in the first sub-pixel SPX1 may protrude toward the first data line DTL1, a second protrusion PP2 of the second low potential voltage line VSL2 in the second sub-pixel SPX2 may protrude toward the second data line DTL2, and a third protrusion PP3 of the third low potential voltage line VSL3 in the third sub-pixel SPX3 may protrude toward the third data line DTL3. The first low potential voltage line VSL1 of the first sub-pixel SPX1 may at least partially overlap the initialization voltage line VIL adjacent thereto. For example, the first protrusion PP1 of the first low potential voltage line VSL1 may at least partially overlap the initialization voltage line VIL.

The initialization voltage line VIL may be covered by the first interlayer insulating layer 17, and the first interlayer insulating layer 17 may cover the initialization voltage line VIL, and a step may be formed due to the initialization voltage line VIL. The first low potential voltage line VSL1 disposed on the first interlayer insulating layer 17 may be disposed on the first interlayer insulating layer 17 having the stepped portion, and a step may be similarly formed along the stepped portion of the first interlayer insulating layer 17. The second interlayer insulating layer 18 and the first planarization layer 19 may be disposed on the first low potential voltage line VSL1.

During the manufacturing process of the display device 10, a step of forming the second electrode contact hole CTS for connecting each of the low potential voltage lines VSL1, VSL2, and VSL3 to the second electrode 22 may be performed. Taking the first sub-pixel SPX1 as an example, the second interlayer insulating layer 18 may be formed on the first low potential voltage line VSL1, and the second interlayer insulating layer 18 may be partially etched to expose the first low potential voltage line VSL1. Thereafter, the first planarization layer 19 may be formed and partially etched to form the second electrode contact hole CTS that exposes the first low potential voltage line VSL1.

The etching process of the second interlayer insulating layer 18 and the first planarization layer 19 may be performed through exposure, development, and etching steps using a photolithography method. Here, a step may be formed on the second interlayer insulating layer 18 due to the stepped portion of the first low potential voltage line VSL1 disposed therebelow. A photoresist may be applied on the second interlayer insulating layer 18 having the stepped portion, and in the process of exposing and developing the photoresist, regions having different thicknesses of the photoresist may be formed according to the stepped portion of the second interlayer insulating layer 18. Accordingly, the exposure degree of the photoresist may be different, and in case that the photoresist is developed and etched, the exposure of the first low potential voltage line VSL1 may be incompletely performed. Subsequently, in case that the first planarization layer 19 is formed and the second electrode contact hole CTS is finally formed, the plane size of the second electrode contact hole CTS exposing the first low potential voltage line VSL1 may be formed smaller than that in the design. Accordingly, a defect may occur in the contact between the first low potential voltage line VSL1 and the second electrode 22 through the second electrode contact hole CTS. Due to this, the total resistance of the initialization voltage lines VIL connected to the first sub-pixel SPX1 may be changed, and a defect in which light may not be emitted may occur in the second sub-pixel SPX2 and the third sub-pixel SPX3 connected to the initialization voltage line VIL through the initialization voltage distribution line IDL. This results in a reddish defect in which only red light may be viewed in some areas in case that the display device 10 is driven in white.

The display device 10 according to an embodiment may further include an auxiliary pattern AP for flattening the stepped portion of the first low potential voltage line VSL1 in order to prevent a defect in the second electrode contact hole CTS.

Referring to FIGS. 9 and 10, the auxiliary pattern AP may be disposed on the first low potential voltage line VSL1 of the first sub-pixel SPX1. The auxiliary pattern AP may not be disposed on the second low potential voltage line VSL2 of the second sub-pixel SPX2 and the third low potential voltage line VSL3 of the third sub-pixel SPX3. For example, the auxiliary pattern AP may overlap the first low potential voltage line VSL1 of the first sub-pixel SPX1, and may not overlap the second low potential voltage line VSL2 of the second sub-pixel SPX2 and the third low potential voltage line VSL3 of the third sub-pixel SPX3.

In the first sub-pixel SPX1, the auxiliary pattern AP may not overlap the first data line DTL1 and the initialization voltage line VIL adjacent thereto. Since the region of the first low potential voltage line VSL1 where the step may be formed may be a region that does not overlap the initialization voltage line VIL, the auxiliary pattern AP may not overlap the initialization voltage line VIL. The auxiliary pattern AP may completely overlap the first low potential voltage line VSL1. The fact that the auxiliary pattern AP completely overlaps the first low potential voltage line VSL1 may mean that at least one side of the auxiliary pattern AP does not protrude more outward than at least one side of the first low potential voltage line VSL1. For example, the auxiliary pattern AP may be in contact with the first low potential voltage line VSL1 but may not be in contact with the first interlayer insulating layer 17 disposed therebelow. In an embodiment, at least one side of the auxiliary pattern AP may be aligned and coincide with at least one side of the first low potential voltage line VSL1.

The top surface of the auxiliary pattern AP may be aligned and coincide with the top surface of the first low potential voltage line VSL1. Specifically, the top surface of the auxiliary pattern AP may be aligned and coincide with the top surface of the first low potential voltage line VSL1 that overlaps the initialization voltage line VIL. A distance L1 from the top surface of the first planarization layer 19 to the top surface of the auxiliary pattern AP may be the same as a distance L2 from the top surface of the first planarization layer 19 to the top surface of the closest first low potential voltage line VSL1.

In an embodiment, the auxiliary pattern AP may be in direct contact with the second electrode 22 together with the first low potential voltage line VSL1. To this end, the second electrode contact hole CTS may expose the auxiliary pattern AP and the first low potential voltage line VSL1. The auxiliary pattern AP may include a conductive material in order to transmit the second power voltage of the first low potential voltage line VSL1 to the second electrode 22. The conductive material may be a low-resistance metal, for example, titanium (Ti) or copper (Cu). However, the disclosure is not limited thereto and may include a material having conductivity, for example, a material such as a metal oxide.

As described above, the display device 10 according to an embodiment may further include the auxiliary pattern AP for flattening the stepped portion of the first low potential voltage line VSL1, thereby preventing a defect in the second electrode contact hole CTS. Accordingly, it may be possible to improve the display quality by improving the reddish defect of the display device 10.

Figure 11:
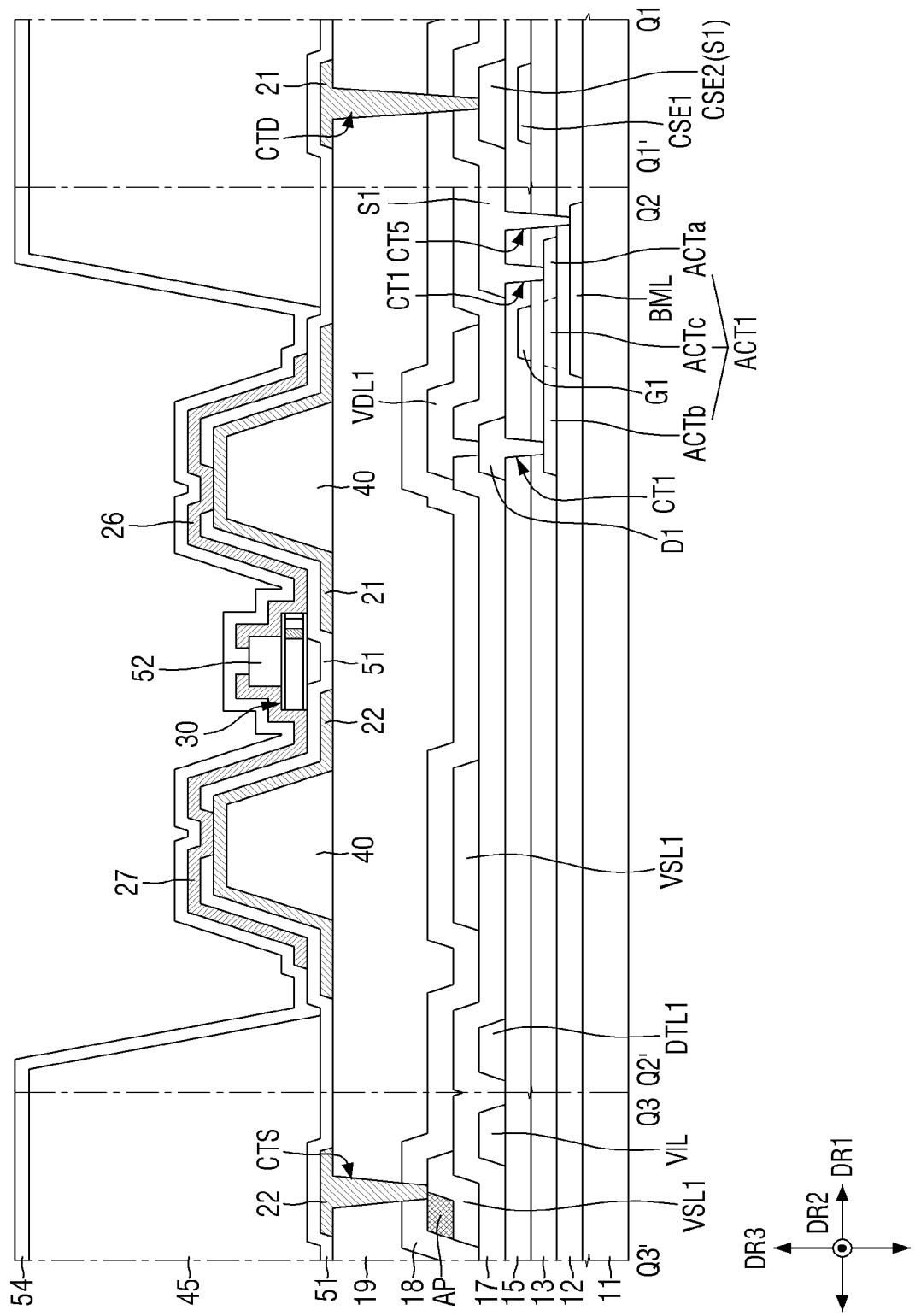
FIG. 11 is a schematic cross-sectional view illustrating a part of a display device according to another embodiment.

FIG. 11 is a schematic cross-sectional view illustrating a part of a display device according to another embodiment.

Referring to FIG. 11, in the display device 10, the third insulating layer 53 may be omitted. A part of the second contact electrode 27 may be directly disposed on the second insulating layer 52, and the first contact electrode 26 and the second contact electrode 27 may be spaced apart from each other on the second insulating layer 52. According to an embodiment, in the display device 10, even if the third insulating layer 53 may be omitted, the second insulating layer 52 may include an organic insulating material to perform a function of fixing the light emitting element 30. The first contact electrode 26 and the second contact electrode 27 may be simultaneously formed through a patterning process. An embodiment of FIG. 11 may be the same as an embodiment of FIG. 8 except at least that the third insulating layer 53 may be further omitted. Hereinafter, redundant description will be omitted.

Figure 12:
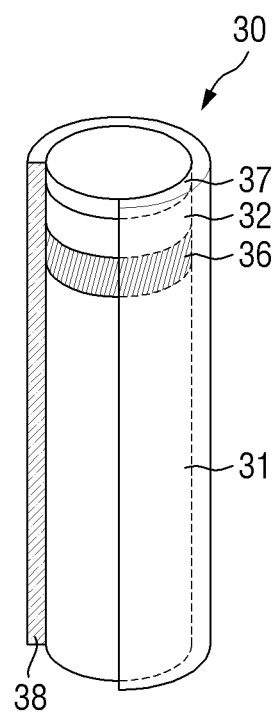
FIG. 12 is a schematic diagram of a light emitting element according to an embodiment.

FIG. 12 is a schematic diagram of a light emitting element according to an embodiment.

The light emitting element 30 may be a light emitting diode. Specifically, the light emitting element 30 may be an inorganic light emitting diode that has a micrometer or nanometer size, and may be made of an inorganic material. The inorganic light emitting diode may be aligned between two electrodes having polarity in case that an electric field is formed in a specific direction between two electrodes opposing each other. The light emitting element 30 may be aligned between two electrodes by the electric field generated between the electrodes.

The light emitting element 30 according to an embodiment may have a shape extending in a direction. The light emitting element 30 may have a shape of a rod, wire, tube, or the like. In an embodiment, the light emitting element 30 may have a cylindrical or rod shape. However, the shape of the light emitting element 30 is not limited thereto, and the light emitting element 30 may have a polygonal prism shape such as a regular cube, a rectangular parallelepiped, or a hexagonal prism, or may have various shapes such as a shape extending in a direction and having an outer surface partially inclined. Semiconductors included in the light emitting element 30 to be described later may have a structure in which they may be sequentially arranged or stacked along the direction.

The light emitting element 30 may include a semiconductor layer doped with any conductivity type (e.g., p-type or n-type) impurities. The semiconductor layer may emit light of a specific wavelength band by receiving an electrical signal applied from an external power source.

Referring to FIG. 12, the light emitting element 30 may include a first semiconductor layer 31, a second semiconductor layer 32, a light emitting layer 36, an electrode layer 37, and an insulating film 38.

The first semiconductor layer 31 may be an n-type semiconductor. For example, in case that the light emitting element 30 emits light of a blue wavelength band, the first semiconductor layer 31 may include a semiconductor material having a chemical formula of AlxGayIn1-x-yN (0≤x≤1, 0≤y≤1, 0≤x+y≤1). For example, it may be at least one of n-type doped AlGaInN, GaN, AlGaN, InGaN, AlN and InN. The first semiconductor layer 31 may be doped with an n-type dopant. For example, the n-type dopant may be Si, Ge, Sn, or the like. In an embodiment, the first semiconductor layer 31 may be n-GaN doped with n-type Si. The length of the first semiconductor layer 31 may have a range of about 1.5 μm to about 5 μm, but is not limited thereto.

The second semiconductor layer 32 may be disposed on the light emitting layer 36 to be described later. The second semiconductor layer 32 may be a p-type semiconductor. For example, in case that the light emitting element 30 emits light of a blue or green wavelength band, the second semiconductor layer 32 may include a semiconductor material having a chemical formula of AlxGayIn1-x-yN (0≤x≤1, 0≤y≤1, 0≤x+y≤1). For example, it may be at least one of p-type doped AlGaInN, GaN, AlGaN, InGaN, AlN and InN. The second semiconductor layer 32 may be doped with a p-type dopant. For example, the p-type dopant may be Mg, Zn, Ca, Se, Ba, or the like. In an embodiment, the second semiconductor layer 32 may be p-GaN doped with p-type Mg. The length of the second semiconductor layer 32 may have a range of about 0.05 μm to about 0.10 μm, but is not limited thereto.

Although it is illustrated in the drawing that the first semiconductor layer 31 and the second semiconductor layer 32 may be configured as one layer, the disclosure is not limited thereto. According to some embodiments, depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. For example, in case that the light emitting layer 36 emits light of a blue wavelength band, a material such as AlGaN or AlGaInN may be included. In particular, in case that the light emitting layer 36 has a structure in which quantum layers and well layers may be alternately stacked in a multiple quantum well structure, the quantum layer may include a material such as AlGaN or AlGaInN, and the well layer may include a material such as GaN or AlInN. In an embodiment, the light emitting layer 36 may include AlGaInN as a quantum layer and AlInN as a well layer, and the light emitting layer 36 may emit blue light having a central wavelength band of about 450 nm to about 495 nm.

However, the disclosure is not limited thereto, and the light emitting layer 36 may have a structure in which semiconductor materials having large band gap energy and semiconductor materials having small band gap energy may be alternately stacked, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases. The length of the light emitting layer 36 may have a range of about 0.05 μm to about 0.10 μm, but is not limited thereto.

Light emitted from the light emitting layer 36 may be emitted to both side surfaces as well as the outer surface of the light emitting element 30 in a longitudinal direction. The directionality of light emitted from the light emitting layer 36 is not limited to one direction.

The electrode layer 37 may be an ohmic contact electrode. However, the disclosure is not limited thereto, and they may be a Schottky contact electrode. The light emitting element 30 may include at least one electrode layer 37. Although FIG. 12 illustrates that the light emitting element 30 includes one electrode layer 37, the disclosure is not limited thereto. In some cases, the light emitting element 30 may include a larger number of electrode layers 37 or may be omitted. The following description of the light emitting element 30 may be equally applied even if the number of electrode layers 37 may be different or further includes other structures.

In the display device 10 according to an embodiment, in case that the light emitting element 30 is electrically connected to an electrode or a contact electrode, the electrode layer 37 may reduce the resistance between the light emitting element 30 and the electrode or contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The electrode layer 37 may include the same material or different materials, but is not limited thereto.

The insulating film 38 may be arranged to surround the outer surfaces of the semiconductor layers and electrode layers. In an embodiment, the insulating film 38 may be arranged to surround at least the outer surface of the light emitting layer 36 and extend along the extension direction of the light emitting element 30. The insulating film 38 may function to protect the members. For example, the insulating film 38 may be formed to surround side surfaces of the members to expose ends of the light emitting element 30 in the longitudinal direction.

Although it is illustrated in the drawing that the insulating film 38 extends in the longitudinal direction of the light emitting element 30 to cover a region from the first semiconductor layer 31 to the side surface of the electrode layer 37, the disclosure is not limited thereto. The insulating film 38 may include the light emitting layer 36 to cover only the outer surfaces of some semiconductor layers, or may cover only a part of the outer surface of the electrode layer 37 to partially expose the outer surface of each electrode layer 37. Further, in cross-sectional view, the insulating film 38 may have a top surface, which may be rounded in a region adjacent to at least one end of the light emitting element 30.

The thickness of the insulating film 38 may have a range of about 10 nm to about 1.0 μm, but is not limited thereto. In an embodiment, the thickness of the insulating film 38 may be about 40 nm.

The insulating film 38 may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, it may be possible to prevent an electrical short circuit that may occur in case that the light emitting layer 36 is in direct contact with the electrode through which the electrical signal may be transmitted to the light emitting element 30. Since the insulating film 38 protects the outer surface of the light emitting element 30 including the light emitting layer 36, it may be possible to prevent degradation in light emission efficiency.

Further, in some embodiments, the insulating film 38 may have an outer surface which may be surface-treated. The light emitting elements 30 may be injected onto the electrode in a state of being dispersed in an ink to be aligned. Here, the surface of the insulating film 38 may be treated in a hydrophobic or hydrophilic manner in order to keep the light emitting elements 30 in a dispersed state without aggregation with other light emitting elements 30 adjacent in the ink.

The light emitting element 30 may have a length h of about 1 μm to about 10 μm or about 2 μm to about 6 μm, and in an embodiment, about 3 μm to about 5 μm. Further, a diameter of the light emitting element 30 may have a range of about 30 nm to about 700 nm, and an aspect ratio of the light emitting element 30 may be about 1.2 to about 100. However, the disclosure is not limited thereto, and the light emitting elements 30 included in the display device 10 may have different diameters according to a difference in composition of the light emitting layer 36. In an embodiment, the diameter of the light emitting element 30 may have a range of about 500 nm.

Figure 13:
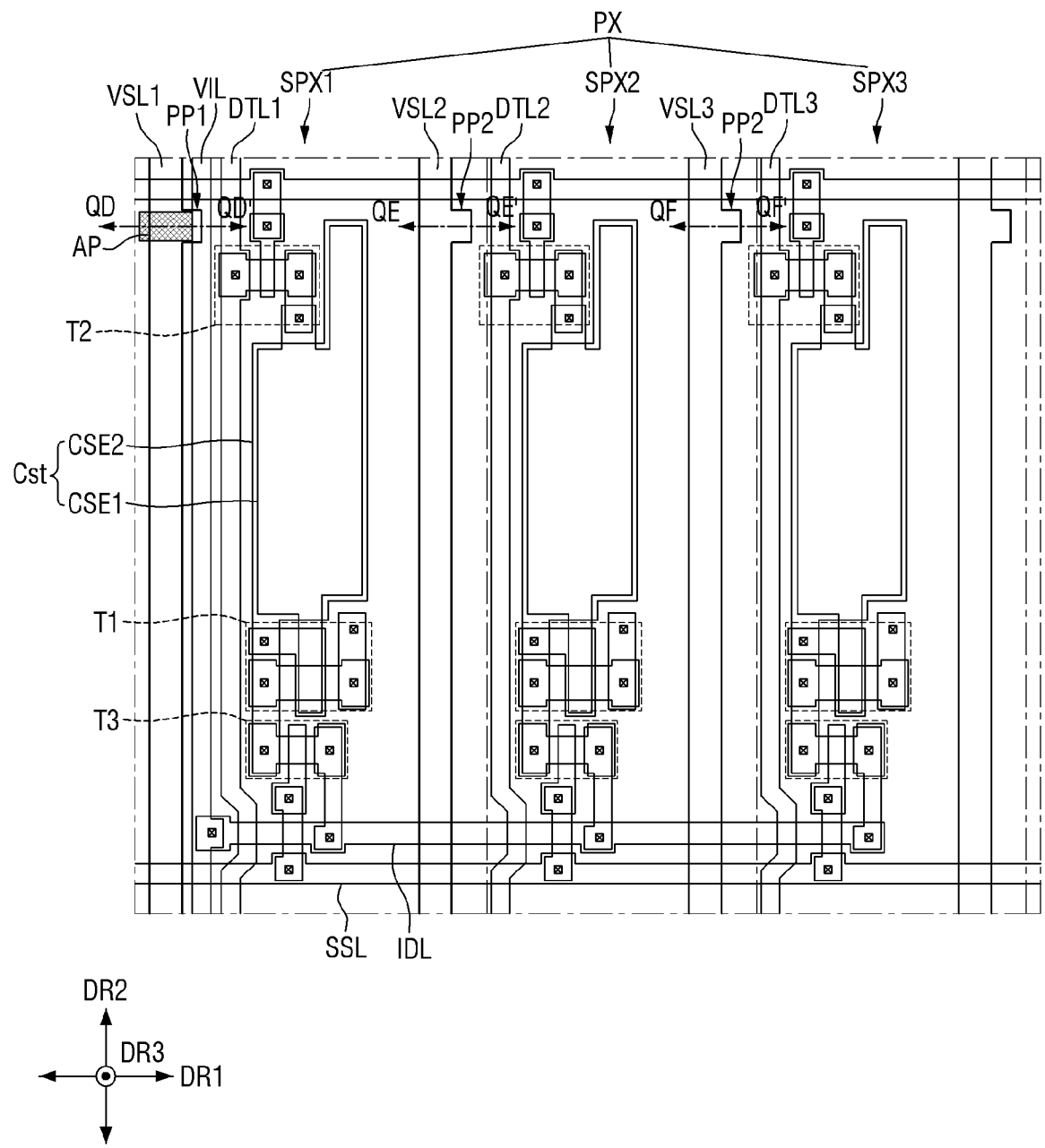
FIG. 13 is a schematic diagram illustrating conductive layers included in a pixel of a display device according to still another embodiment.
Figure 14:
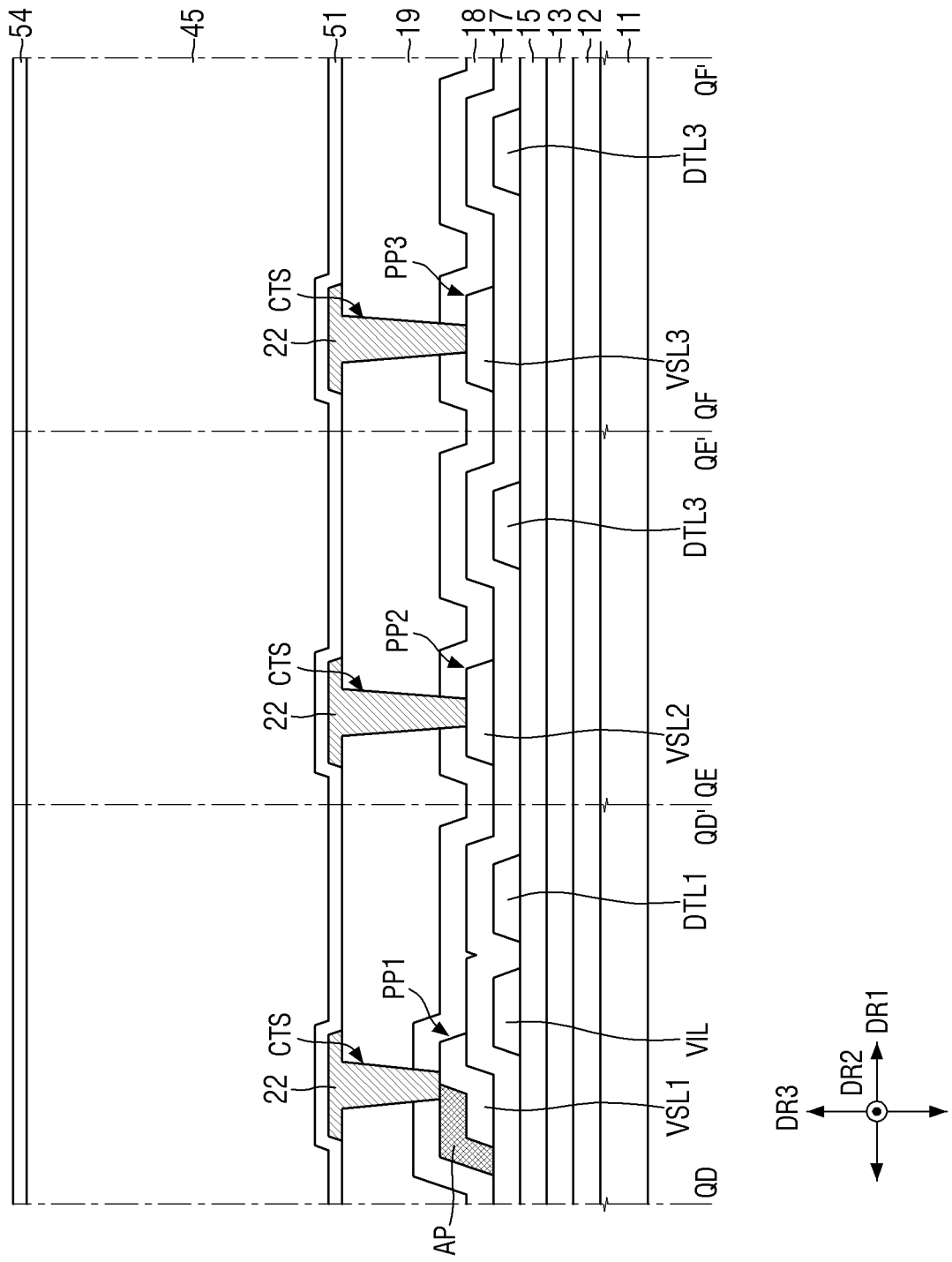
FIG. 14 is a schematic cross-sectional view taken along lines QD-QD', QE-QE', and QF-QF' of FIG. 13.

FIG. 13 is a schematic diagram illustrating conductive layers included in a pixel of a display device according to still another embodiment. FIG. 14 is a schematic cross-sectional view taken along lines QD-QD', QE-QE', and QF-QF' of FIG. 13.

Referring to FIGS. 13 and 14, an embodiment may be different from above-described embodiments at least in that the auxiliary pattern AP may cover at least one side surface of the first low potential voltage line VSL1. In the following description, a redundant description will be omitted and differences will be described.

The auxiliary pattern AP may be disposed on the first low potential voltage line VSL1. At least a part of the auxiliary pattern AP may overlap the first low potential voltage line VSL1 and the other part thereof may not overlap the first low potential voltage line VSL1. For example, at least one side of the auxiliary pattern AP may protrude more outward than at least one side of the first low potential voltage line VSL1. In an embodiment, at least one side of the auxiliary pattern AP may not be aligned with at least one side of the first low potential voltage line VSL1.

The auxiliary pattern AP may be in contact with the first low potential voltage line VSL1, and a part of the auxiliary pattern AP protruding more outward than at least one side of the first low potential voltage line VSL1 may be in contact with the first interlayer insulating layer 17 disposed therebelow. The auxiliary pattern AP may be in contact with a side surface of the first low potential voltage line VSL1, while being in contact with the top surface of the first low potential voltage line VSL1.

In an embodiment, since the auxiliary pattern AP may further protrude outward while covering the side surface of the first low potential voltage line VSL1, there may be an advantage in that a process margin can be further secured during a process of forming the second electrode contact hole CTS.

Figure 15:
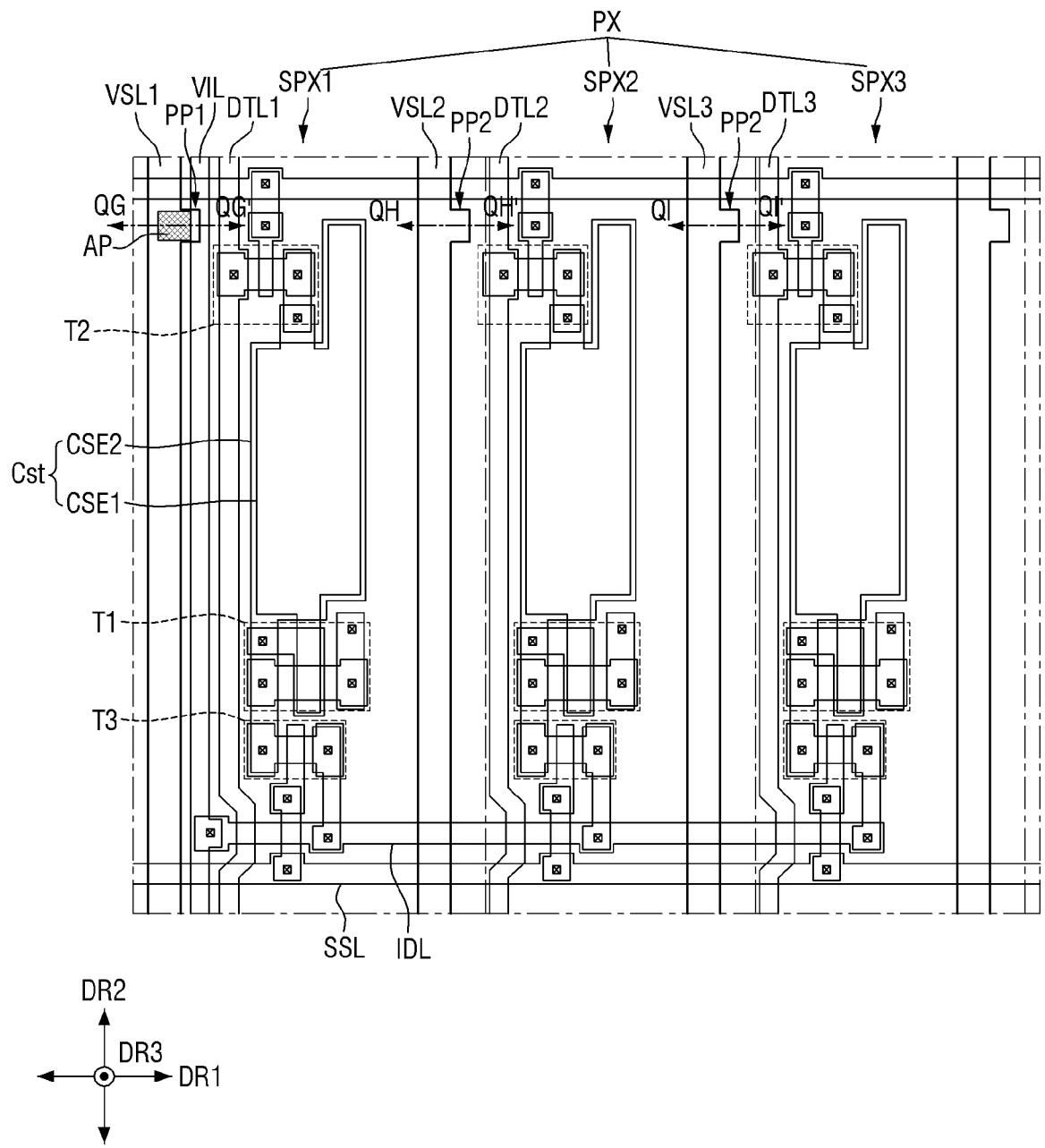
FIG. 15 is a schematic diagram illustrating conductive layers included in a pixel of a display device according to still another embodiment.
Figure 16:
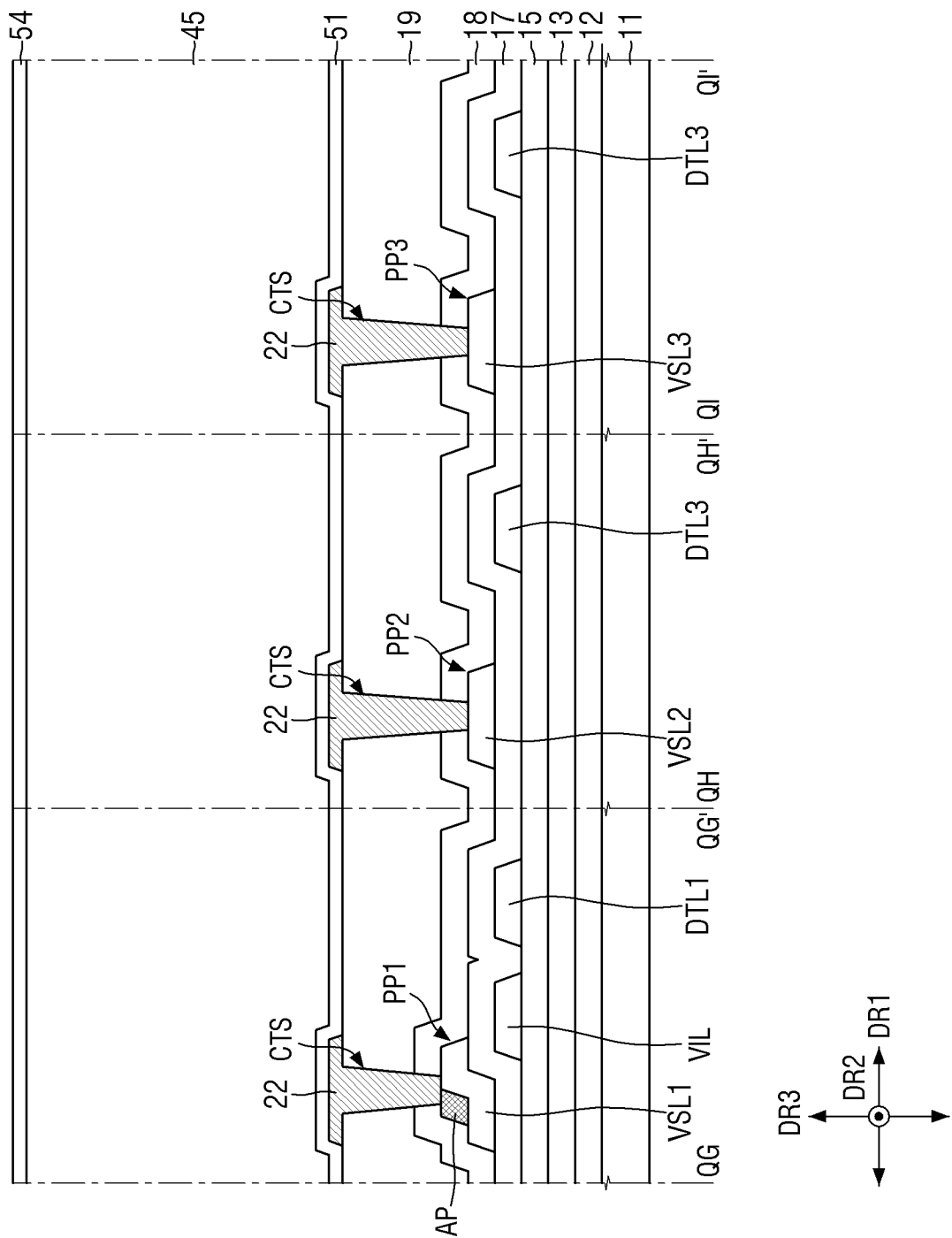
FIG. 16 is a schematic cross-sectional view taken along lines QG-QG', QH-QH', and QI-QI' of FIG. 15.

FIG. 15 is a schematic diagram illustrating conductive layers included in a pixel of a display device according to still another embodiment. FIG. 16 is a schematic cross-sectional view taken along lines QG-QG', QH-QH', and QI-QI' of FIG. 15.

Referring to FIGS. 15 and 16, an embodiment may be different from above-described embodiments at least in that the auxiliary pattern AP may be spaced apart inward from at least one side surface of the first low potential voltage line VSL1. In the following description, a redundant description will be omitted and differences will be described.

The auxiliary pattern AP may be disposed on the first low potential voltage line VSL1 and may overlap the first low potential voltage line VSL1. In particular, the auxiliary pattern AP may completely overlap the first low potential voltage line VSL1. At least one side of the auxiliary pattern AP may be spaced apart inward from at least one side of the first low potential voltage line VSL1. For example, at least one side of the auxiliary pattern AP may overlap the top surface of the first low potential voltage line VSL1. In an embodiment, at least one side of the auxiliary pattern AP may not be aligned with at least one side of the first low potential voltage line VSL1. The auxiliary pattern AP may be in contact with the top surface of the first low potential voltage line VSL1, but may not be in contact with the first interlayer insulating layer 17 disposed therebelow.

Hereinafter, the manufacturing process of the display device 10 will be described in detail with further reference to other drawings, but the structure of members and the method of forming them will be briefly described and the sequence of the manufacturing process will be described in detail. The manufacturing method will be described with reference to drawings corresponding to a cross section of the first sub-pixel SPX1 of the display device 10 shown in FIG. 8.

FIGS. 17 to 22 are schematic cross-sectional views for steps illustrating a manufacturing method of a display device according to an embodiment.

Figure 17:
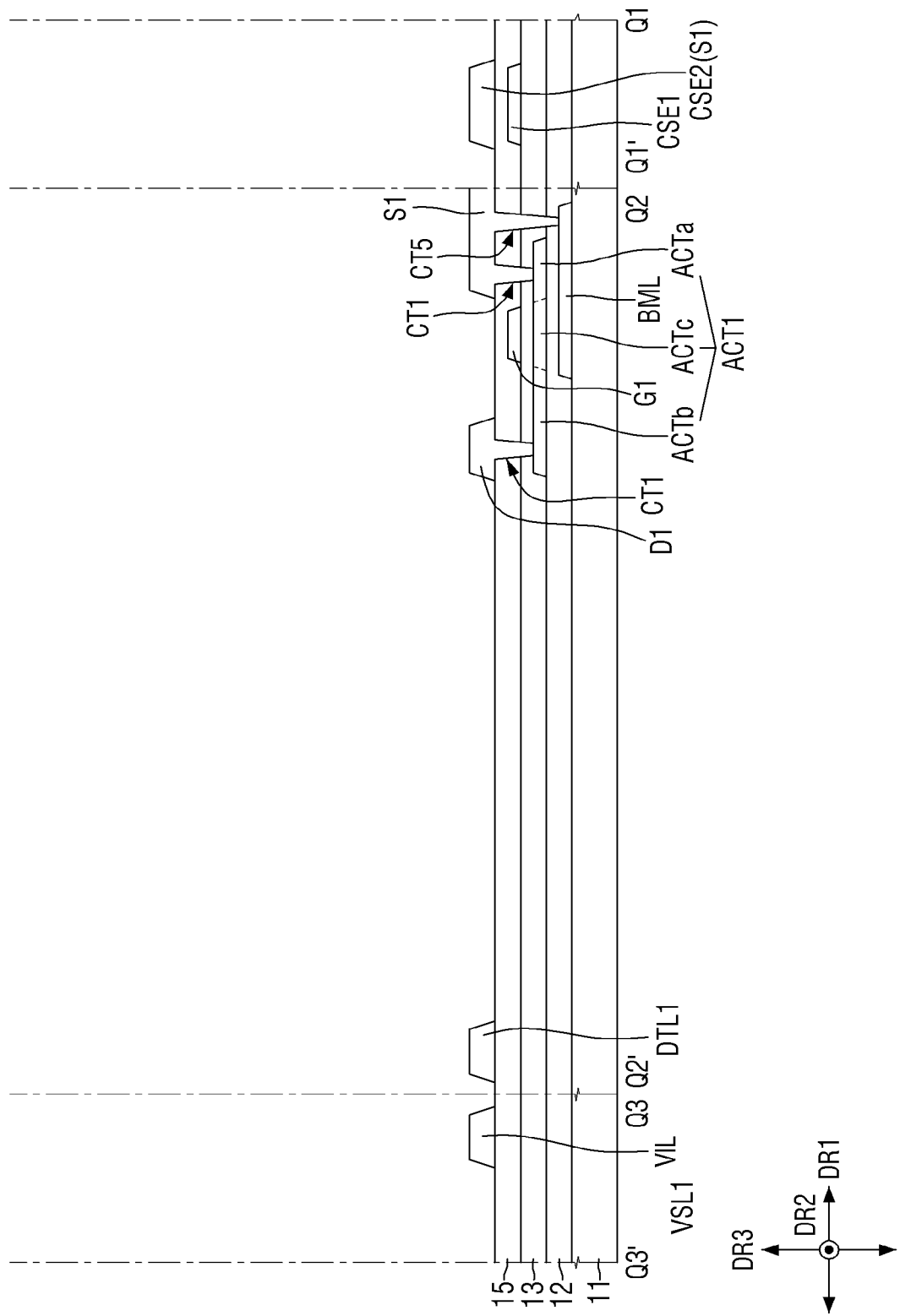
FIGS. 17 to 22 are schematic cross-sectional views for steps illustrating a manufacturing method of a display device according to an embodiment.

Referring to FIG. 17, the light blocking layer BML, may be formed on the substrate 11 and the buffer layer 12 may be formed on the light blocking layer BML. The first active layer ACT1 may be formed on the buffer layer 12, and the first gate insulating layer 13 may be formed on the first active layer ACT1. The gate electrode G1 and the first capacitance electrode CSE1 of the capacitor may be formed as the first gate conductive layer on the first gate insulating layer 13.

The first protective layer 15 may be formed on the gate electrode G1 and the first capacitance electrode CSE1 of the capacitor. The first protective layer 15 and the first gate insulating layer 13 may be etched to form a first contact hole CT1 exposing the conductive regions ACTa and ACTb of the first active layer ACT1. The first protective layer 15, the first gate insulating layer 13, and the buffer layer 12 may be etched to form a fifth contact hole CT5 exposing the light blocking layer BML.

The first source electrode S1, the first drain electrode D1, the first data line DTL1, the initialization voltage line VIL, and the second capacitance electrode CSE2 of the capacitor may be formed as the first data conductive layer on the first protective layer 15. The first source electrode S1 may be connected to the first active layer ACT1 through the first contact hole CT1 and may be connected to the light blocking layer BML through the fifth contact hole CT5. The first drain electrode D1 may be connected to the first active layer ACT1 through the first contact hole CT1.

Figure 18:
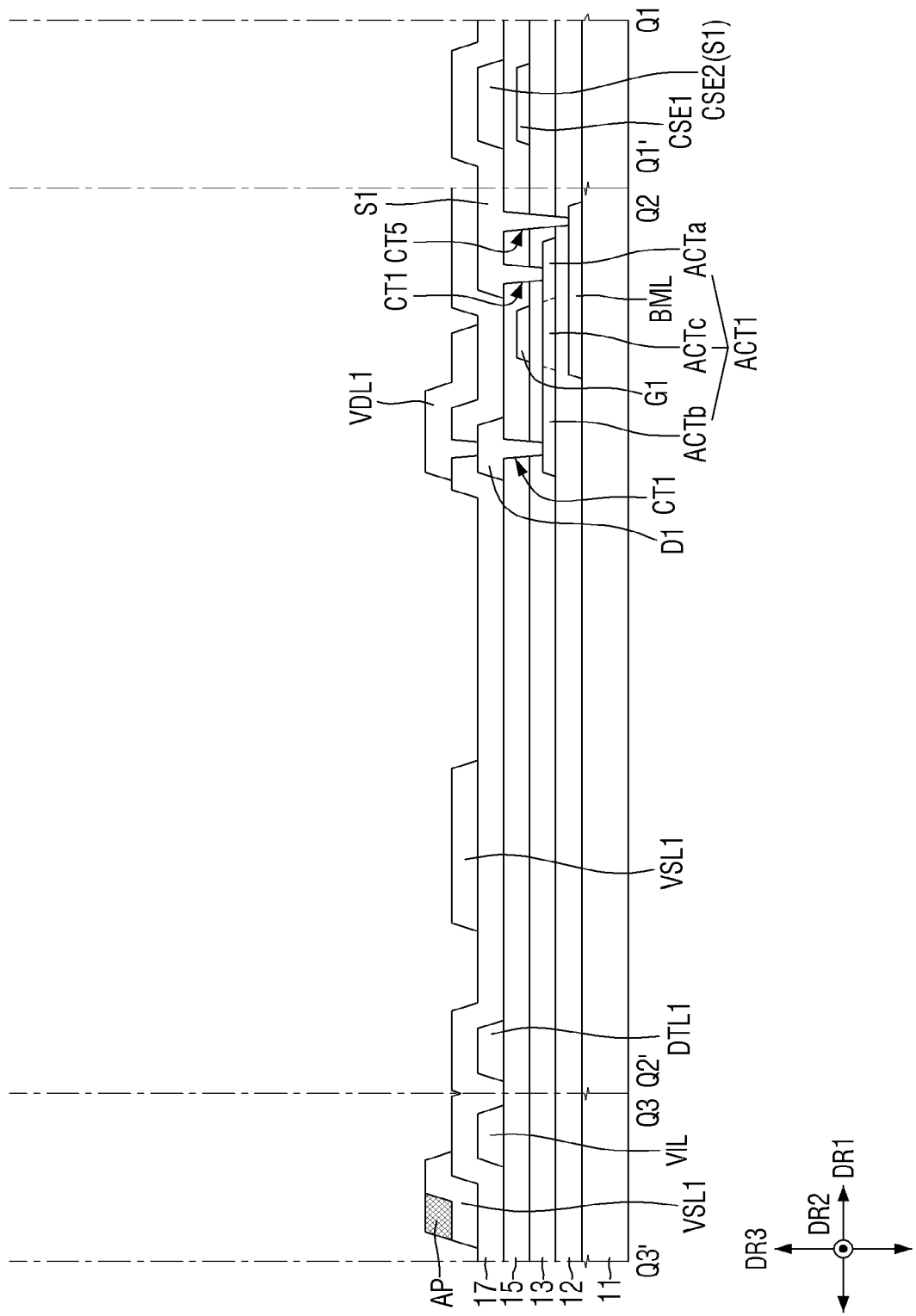

Referring to FIG. 18, the first interlayer insulating layer 17 may be formed on the first data conductive layer. The first interlayer insulating layer 17 may be formed so as to be stepped along the step of the first source electrode S1, the first drain electrode D1, the first data line DTL1, the initialization voltage line VIL, and the second capacitance electrode CSE2 of the capacitor disposed therebelow.

The first high potential voltage line VDL1 and the first low potential voltage line VSL1 may be formed as the second data conductive layer on the first interlayer insulating layer 17. The first low potential voltage line VSL1 may be formed to at least partially overlap the initialization voltage line VIL and to have a step along the stepped portion of the first interlayer insulating layer 17.

The auxiliary pattern AP may be formed as a third data conductive layer on the first low potential voltage line VSL1. The auxiliary pattern AP may be formed on the top surface of the first low potential voltage line VSL1, and may be formed to be aligned with the top surface of the first low potential voltage line VSL1 that overlaps the initialization voltage line VIL. The top surface of the auxiliary pattern AP and the top surface of the first low potential voltage line VSL1 may be aligned with each other and planarized.

Figure 19:
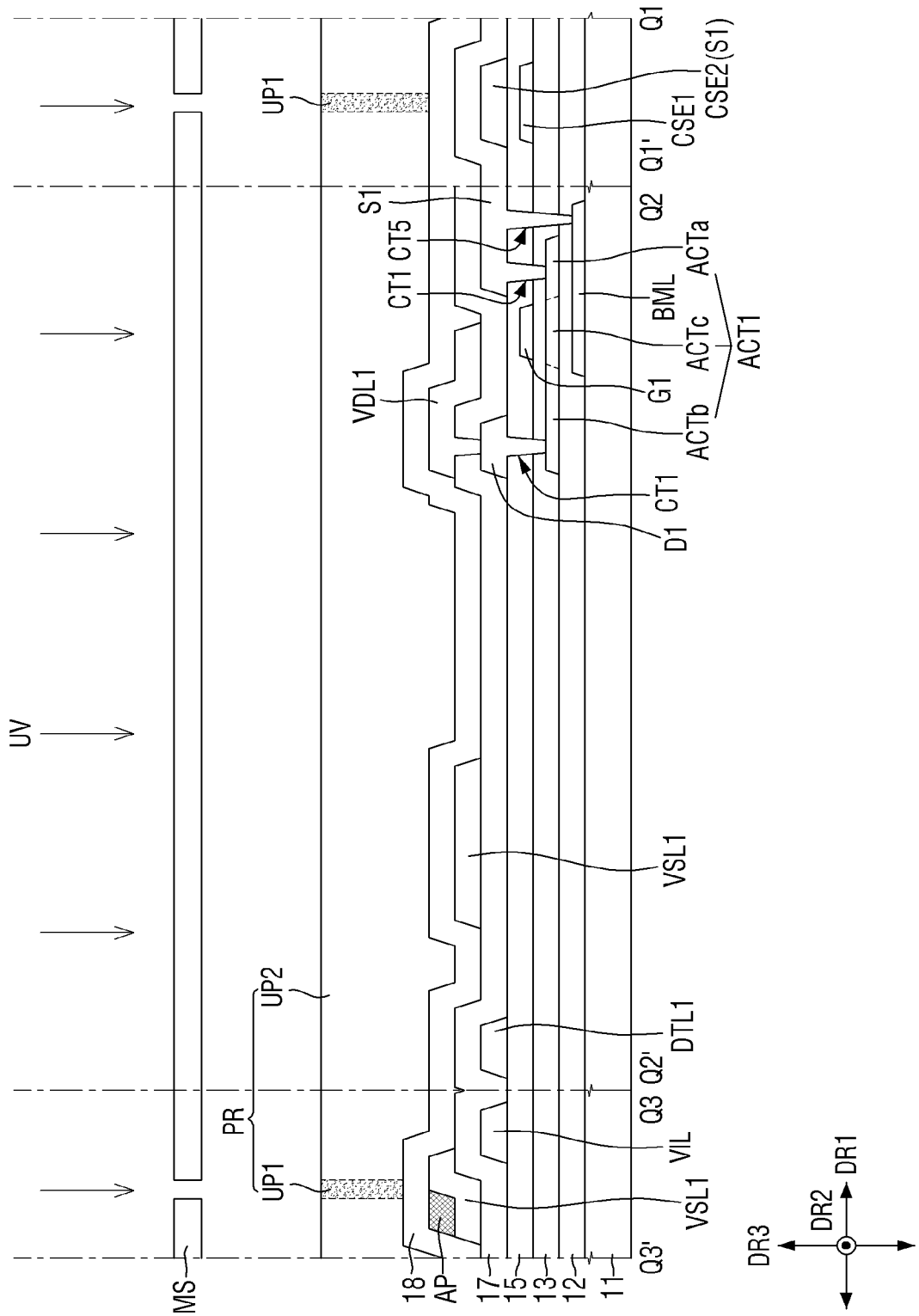

Referring to FIG. 19, the second interlayer insulating layer 18 may be formed on the third data conductive layer. A photoresist PR may be applied on the second interlayer insulating layer 18, a mask MS may be aligned, and UV may be exposed. The mask MS may have an open region for exposing the auxiliary pattern AP, the first low potential voltage line VSL1, and the second capacitance electrode CSE2 of the capacitor. The photoresist PR irradiated with UV through the open region of the mask MS may be formed as first regions UP1, and the photoresist PR masked by the mask MS and not irradiated with UV may be formed as a second region UP2.

In an embodiment, the top surfaces of the auxiliary pattern AP and the first low potential voltage line VSL1 may be flat, and thus the second interlayer insulating layer 18 disposed thereon may also be formed to have a flat top surface. Accordingly, the thickness of the photoresist PR formed in a region where the auxiliary pattern AP and the first low potential voltage line VSL1 overlap each other may be uniform, so that the exposure amount of the first region UP1 may be uniform.

Figure 20:
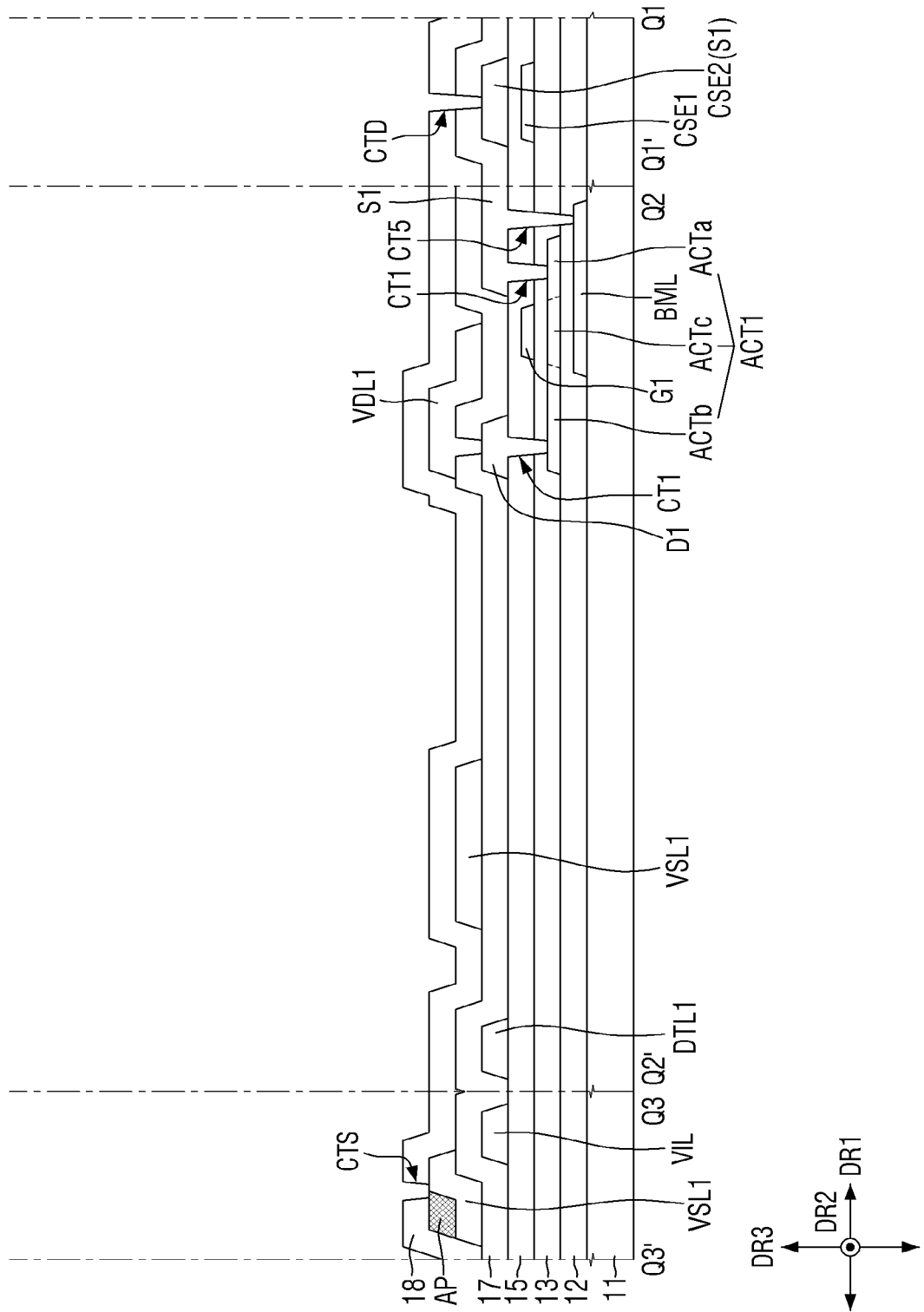

Referring to FIG. 20, the photoresist PR may be developed to remove the first regions UP1, and the second interlayer insulating layer 18 may be dry-etched to form the second electrode contact hole CTS. The first interlayer insulating layer 17 and the second interlayer insulating layer 18 may be dry-etched to form the first electrode contact hole CTD. Thereafter, the photoresist PR may be stripped and removed. In an embodiment, the exposure amount of the first region UP1 of the photoresist PR becomes uniform, so that the first region UP1 may be completely removed during development. Accordingly, the second electrode contact hole CTS exposing the auxiliary pattern AP and the first low potential voltage line VSL1 may be formed without defects by the dry etching process of the second interlayer insulating layer 18.

Figure 21:
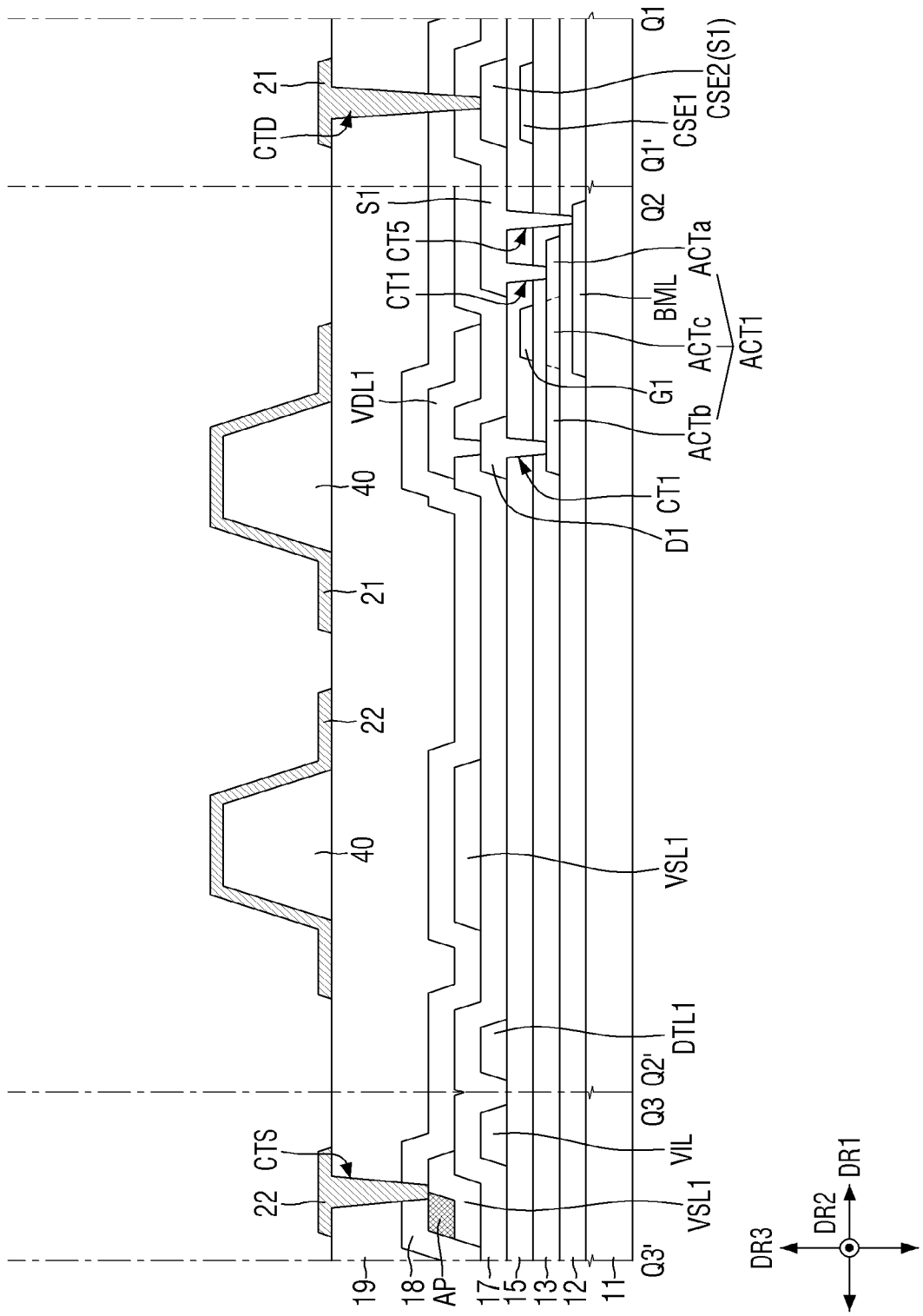

Referring to FIG. 21, the first planarization layer 19 may be formed on the second interlayer insulating layer 18, and the first planarization layer 19 may be etched to finish the manufacturing of the second electrode contact hole CTS exposing the auxiliary pattern AP and the first low potential voltage line VSL1. The first banks 40 may be formed on the first planarization layer 19, and the first electrode 21 and the second electrode 22 may be formed on the first banks 40 and the first planarization layer 19. The first electrode 21 may be connected to the second capacitance electrode CSE2 of the capacitor through the first electrode contact hole CTD, and the second electrode 22 may be connected to the auxiliary pattern AP and the first low potential voltage line VSL1 through the second electrode contact hole CTS.

Figure 22:
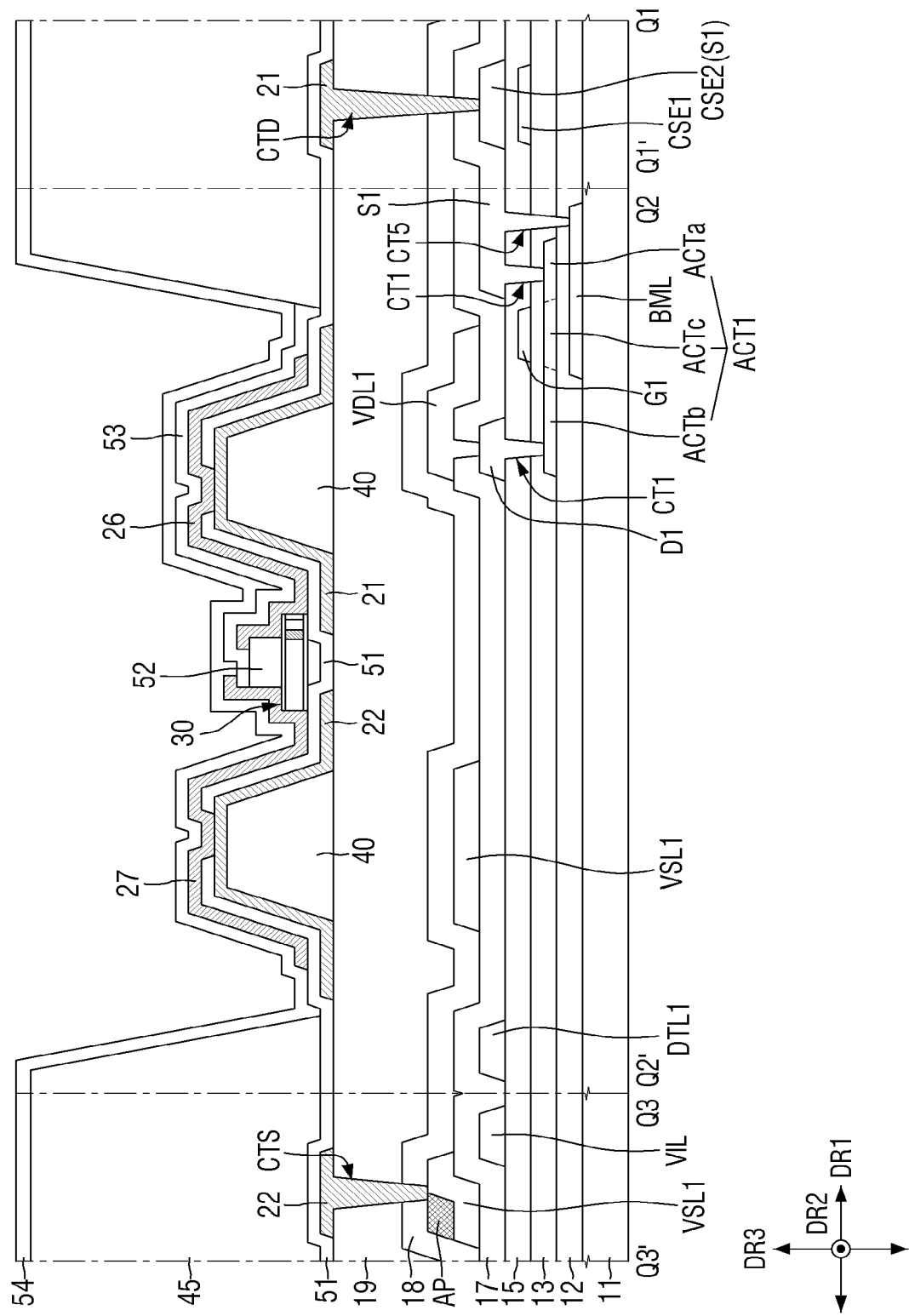

Referring to FIG. 22, the first insulating layer 51 may be formed on the first electrode 21 and the second electrode 22, and the second bank 45 may be formed on the first insulating layer 51. The light emitting element 30 may be applied and aligned using an inkjet printing method to form the light emitting element 30 having ends overlapping the first electrode 21 and the second electrode 22, respectively. The second insulating layer 52 may be formed on the light emitting element 30, and the first contact electrode 26 may be formed on the first insulating layer 51, the light emitting element 30, and the second insulating layer 52. The third insulating layer 53 covering the first contact electrode 26 may be formed, the second contact electrode 27 may be formed on the first insulating layer 51, the light emitting element 30, and the third insulating layer 53, and the fourth insulating layer 54 covering all of them may be formed to manufacture the display device 10.

As described above, a display device 10 according to an embodiment may further include an auxiliary pattern AP for flattening a stepped portion of a first low potential voltage line VSL1, thereby preventing a defect in a second electrode contact hole CTS. Accordingly, it may be possible to improve the display quality by improving (e.g., eliminating) the reddish defect of the display device 10.

In concluding the detailed description, those skilled in the art will appreciate that many variations and modifications can be made to embodiments without substantially departing from the principles of the disclosure. Therefore, the disclosed embodiments are presented in a generic and descriptive sense only and not for purposes of limitation.

What is claimed is:

1. A display device comprising:
   an initialization voltage line disposed in a direction on a substrate;
   a first interlayer insulating layer disposed on the initialization voltage line;
   a low potential voltage line disposed on the first interlayer insulating layer, the low potential voltage line including a stepped portion and overlapping the initialization voltage line;
   an auxiliary pattern disposed on the low potential voltage line and forming a flat portion with the stepped portion of the low potential voltage line;
   a second interlayer insulating layer disposed on the auxiliary pattern;
   a planarization layer disposed on the second interlayer insulating layer;
   a first electrode and a second electrode that are disposed on the planarization layer and spaced apart from each other;
   a light emitting element having ends aligned on the first electrode and the second electrode;
   a first contact electrode electrically contacting an end of the light emitting element; and
   a second contact electrode electrically contacting another end of the light emitting element,
   wherein a distance from a top surface of the planarization layer to a top surface of the auxiliary pattern is equal to a distance from the top surface of the planarization layer to a top surface of the low potential voltage line.

2. The display device of claim 1, wherein a top surface of the auxiliary pattern and a top surface of the low potential voltage line are aligned and coincide with each other.

3. The display device of claim 1, wherein
   the auxiliary pattern overlaps the low potential voltage line, and at least one side of the auxiliary pattern is aligned and coincides with a side of the low potential voltage line.

4. The display device of claim 3, wherein
the auxiliary pattern contacts the top surface of the low potential voltage line, and
the auxiliary pattern does not contact the first interlayer insulating layer.

5. The display device of claim 3, wherein
the auxiliary pattern overlaps the low potential voltage line, and
at least a part of the auxiliary pattern does not overlap the low potential voltage line.

6. The display device of claim 5, wherein
the auxiliary pattern contacts the top surface of the low potential voltage line, and
the auxiliary pattern contacts the first interlayer insulating layer.

7. The display device of claim 1, wherein
the auxiliary pattern overlaps the low potential voltage line, and
the auxiliary pattern has at least one side spaced apart inward from a side of the low potential voltage line.

8. The display device of claim 1, wherein
the auxiliary pattern includes a metal, and
the metal is at least one of titanium and copper.

9. The display device of claim 1, wherein
the auxiliary pattern overlaps the low potential voltage line, and
the auxiliary pattern does not overlap the initialization voltage line.

10. The display device of claim 1, wherein the second electrode overlaps the auxiliary pattern and the low potential voltage line.

11. The display device of claim 10, wherein
the second electrode contacts the auxiliary pattern and the low potential voltage line through a second electrode contact hole, and
the second electrode contact hole exposes the second interlayer insulating layer and the planarization layer.

12. A display device comprising:
a substrate including a first sub-pixel, a second sub-pixel, and a third sub-pixel disposed adjacent to each other;
a low potential voltage line and a data line that are disposed on a side of each of the first sub-pixel, the second sub-pixel, and the third sub-pixel on the substrate;
an initialization voltage line disposed between the low potential voltage line of the first sub-pixel and the data line of the first sub-pixel, the initialization voltage line at least partially overlapping the low potential voltage line;
an auxiliary pattern overlapping the low potential voltage line of the first sub-pixel without overlapping the low potential voltage line of the second sub-pixel and the low potential voltage line of the third sub-pixel;
a first interlayer insulating layer disposed between the initialization voltage line and the low potential voltage line, wherein
a top surface of the auxiliary pattern is aligned and coincides with a top surface of the low potential voltage line of the first sub-pixel, and
the first interlayer insulating layer includes a step formed by the initialization voltage line.

13. The display device of claim 12, wherein
the low potential voltage line of the first sub-pixel includes a stepped portion formed by the step of the first interlayer insulating layer, and
the auxiliary pattern forms a flat portion with the stepped portion of the low potential voltage line.

14. The display device of claim 12, wherein the auxiliary pattern does not overlap the initialization voltage line and the data line of the first sub-pixel.

15. The display device of claim 12, further comprising:
a second interlayer insulating layer disposed on the low potential voltage line;
a planarization layer disposed on the second interlayer insulating layer;
a first electrode and a second electrode that are disposed on the planarization layer and spaced apart from each other;
a light emitting element having ends aligned on the first electrode and the second electrode;
a first contact electrode electrically contacting an end of the light emitting element; and
a second contact electrode electrically contacting another end of the light emitting element.

16. The display device of claim 15, wherein
a distance from a top surface of the planarization layer to a top surface of the auxiliary pattern is equal to a distance from the top surface of the planarization layer to a top surface of the low potential voltage line.

17. The display device of claim 16, wherein
the second electrode contacts the auxiliary pattern and the low potential voltage line through a second electrode contact hole, and
the second electrode contact hole exposes the second interlayer insulating layer and the planarization layer.

18. The display device of claim 12, wherein at least one side of the auxiliary pattern is aligned and coincides with a side of the low potential voltage line.

* * * * *